United States Patent [19]

Piestrup et al.

[11] Patent Number: 5,077,774
[45] Date of Patent: Dec. 31, 1991

[54] X-RAY LITHOGRAPHY SOURCE

[75] Inventors: Melvin A. Piestrup, Woodside; David G. Boyers, Mountain View; Cary Pincus, Sunnyvale, all of Calif.

[73] Assignee: Adelphi Technology Inc., Palo Alto, Calif.

[21] Appl. No.: 570,210

[22] Filed: Aug. 21, 1990

Related U.S. Application Data

[63] Continuation-in-part of Ser. No. 378,907, Jul. 12, 1989, Pat. No. 4,951,304.

[51] Int. Cl.$^5$ .............................. G21K 5/00
[52] U.S. Cl. ................................ 378/179; 378/34
[58] Field of Search ............... 378/119, 84, 85, 145, 378/34

[56] References Cited

U.S. PATENT DOCUMENTS

4,763,344  8/1988  Piestrup .
7,378,907  7/1989  Piestrup .

OTHER PUBLICATIONS

J. R. Maldonado, "X-Ray Lithography, Where it is Now & Where it is Going" (paper presented at the 2nd Workshop on Radiation Induced & on Processing Related Electrically Active Defects on Semiconductor-Insulator Systems, Sep. 1989, MCNC, N.C.

Richard Holman, Intel Corporation, "X-Ray Lithography Using Broadband Sources" (1986) This paper Compares a Variety of Soft XC-Ray Sources for Lithography.

R. H. Pantell, R. A. Gearhart, F. R. Buskirk, "Transition Riadiation as an X-Ray Source," IEEE Quant Electr., vol. 19, pp. 1771-1781, Dec. 1983.

Alan G. Michette, "Optical Systems for Soft X-Rays," (Plenum Press N.Y., 1986) Chap. 2 and 3, p. 37 94.

E. Spiller & R. Feder, "X-Ray Lithography, " Topics in Applied Physics, vol. 22 (New York 1977).

M. A. Piestrup, J. O. Kephart, H. Park, R. K. Klein, R. H. Pantell, P. J. Ebert, M. J. Moran, B. A. Dahling & B. L. Berman, "Measurement of Transition Radiation Form Medium Energy Electrons," Phys Rev. A, vol. 32, pp. 917-927, Aug. 1985.

M. A. Piestrup, M. J. Moran, B. L. Berman, P. Pianetta, D. Seligson, "Transition Radiation as an X-Ray Source for Lithography", SPIE, vol. 773, Electron-Beam X-Ray & Ion Beam Lithographies, pp. 37-44, 1987.

M. L. Cherry, G. Hartman, D. Muller, & T. A. Prince, "Transition Radiation from Relativistic Electrons in Periodic Radiators", Phys Rev. D, vol. 10, pp. 3594-3607, Dec. 1974.

Primary Examiner—Craig E. Church
Attorney, Agent, or Firm—Joseph H. Smith

[57] ABSTRACT

A high-intensity, inexpensive X-ray source for X-ray lithography for the production of integrated circuits. Foil stacks are bombarded with a high-energy electron beam of 25 to 250 MeV to produce a flux of soft X-rays of 500 eV to 3 keV. Methods of increasing the total X-ray power and making the cross section of the X-ray beam uniform are described. Methods of obtaining the desired X-ray-beam field size, optimum frequency spectrum and elminating the neutron flux are all described. A method of obtaining a plurality of station operation is also described which makes the process more efficient and economical. The satisfying of these issues makes transition radiation an exellent moderate-priced X-ray source for lithography.

31 Claims, 26 Drawing Sheets

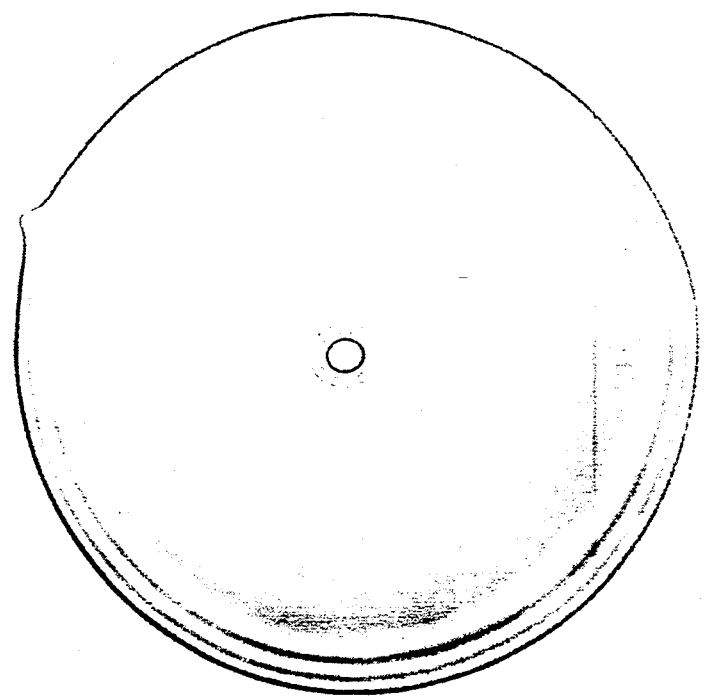
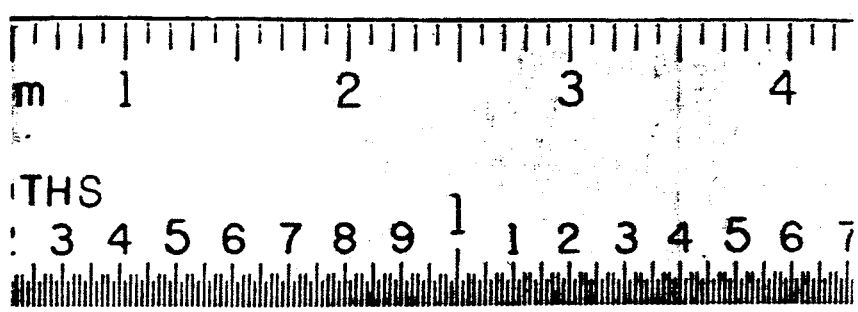
FIG. 6

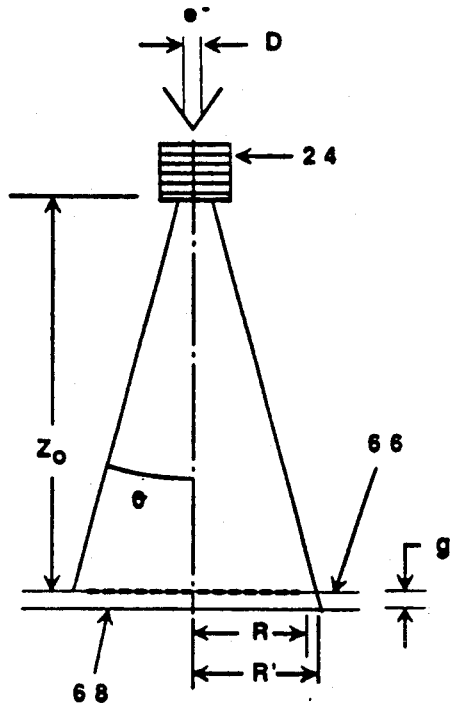
FIG.14
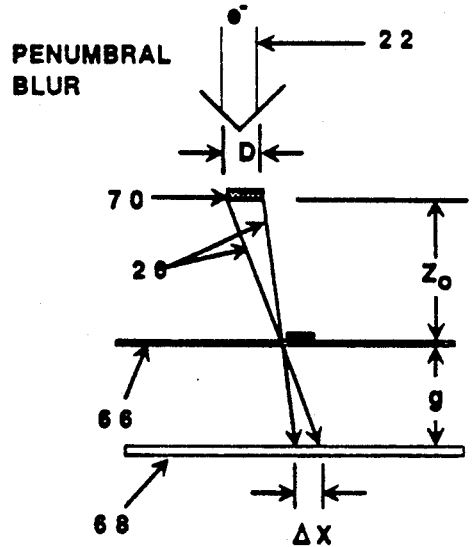
PENUMBRAL BLUR
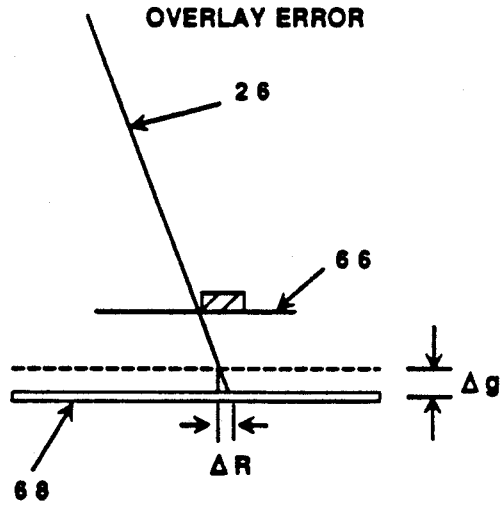
OVERLAY ERROR

X-RAY LITHOGRAPHY SOURCE

This invention was made with Government support under contract No. DE-AC03-85ER80234 awarded under the Department of Energy. The Government has certain rights to this invention.

CROSS REFERENCE TO RELATED APPLICATION

This is a continuation in part of U.S. patent application Ser. No. 7/378,907, filed July 12, 1989, now U.S. Pat. No. 4,951,304 entitled "A Focused X-ray Source" by M. A. Piestrup, D. G. Boyers, C. I. Pincus, and P. Maccagno.

TECHNICAL FIELD

This invention relates to an apparatus which ses transition radiation, X-ray optics and special radiation geometries for the production of high intensity, uniform X rays for lithography in the production of integrated microcircuits.

BACKGROUND OF THE INVENTION

1. Prior Art: X-ray Lithography

Current commercial lithography techniques utilize optical and ultraviolet light to expose photoresist through a mask which has the circuit pattern imprinted on it. Present geometries of the circuit elements are limited by the wavelength of the radiation to greater than 0.5 microns in size. To produce smaller geometries, shorter wavelengths are needed. The use of soft X-rays for the exposure of photoresist will produce geometries of less than 0.25 microns; lines as small as 0.16 microns have already been produced.

Four X-ray sources have been considered for lithography. These are the conventional X-ray tube (or electron impact sources), synchrotron storage ring, laser plasma sources and transition radiators. To date synchrotron and plasma sources have been the most widely discussed and used. Electron-impact sources have intrinsically low X-ray power, requiring 20 minutes or more for small area exposures, and are uncollimated, requiring stringent mask-to-wafer spacing.

Synchrotron radiation has received the most interest as a commercial source for the high-volume production of integrated circuits, where laser-plasma sources have been touted as a relatively inexpensive source of soft X-rays for low-volume integrated-circuit production. The properties of synchrotron radiation which make it useful for X-ray lithography are its high intensity and collimation. See for example E. Spiller and R. Feder, "X-Ray Lithography," Topics in Applied Physics, vol. 22 (ed. H. J. Queisser; Springer Verlag, Berlin, Heidelberg, New York, 1977.)

Unfortunately, synchrotron radiation requires massive machines costing $25 million for the storage ring and $2.5 million per lithographic station for a total of 16 to 24 stations. A 16 station synchrotron based lithography system is projected to have a per station cost of $4M to $5M and a total system cost of $64M to $80M. This exorbitant initial cost has prevented most U.S. companies from entering into X-ray lithography. Thus there is considerable interest in a relatively inexpensive X-ray lithography source which can have an initial cost of 4 to 6 million dollars and have one or several stations with the same cost of 4 to 6 million dollars per station. Laser-plasma sources are a potential single-station source of X rays in this price range. Hampshire Laboratories is producing an experimental system but the system has demonstrated only 2 milliwatts of X-ray power.

Laser-plasma sources have the intrinsic technical problems of low power and lack of collimation. Low X-ray power limits this source to an experimental research tool or, to low volume integrated-circuit production. Lack of collimation requires it to be extremely close to the mask and wafer (10 to 20 cm) to maintain flux density, which then requires the spacing between the mask and wafer to not more than $\pm 0.5$ $\mu$m variation to minimize shadowing and blurring of the circuit image. This required tolerance of $\pm 0.5$ $\mu$m is difficult to achieve and may be prohibitive. The synchrotron source requires a maximum variation of only $\pm 5$ $\mu$m. A new X-ray source is needed with the synchrotron's excellent technical characteristics and laser-plasma's moderate cost.

2. Prior Art: Transition Radiation as an X-ray Lithography Source

In the prior art, transition radiation has been considered as an alternative source of soft X rays by M. A. Piestrup, J. O. Kephart, H. Park, R. K. Klein, R. H. Pantell, P. J. Ebert, M. J. Moran, B. A. Dahling, and B. L. Berman, "Measurement of transition radiation from medium-energy electrons," Phys. Rev. A vol. 32, pp. 917–927, Aug. 1985. and M. A. Piestrup, M. J. Moran, B. L. Berman, P. Pianetta, D. Seligson, "Transition radiation as an X-ray source for lithography," SPIE vol. 773, Electron-Beam, X-ray, and Ion-Beam Lithographies, pp. 37–44, 1987.

Transition radiation has a number of advantages which it shares with synchrotron emitters. Both are high brightness, collimated source. The high degree of radiation parallelism (collimation) decreases geometrical distortions such as run-out and blurring of the circuit elements in a lithograph (See FIG. 1). Unique advantages of transition radiation are its relative low cost, moderate vacuum requirements and excellent spectral characteristics.

One advantage synchrotron radiation now has over transition radiation is that of total X-ray power. Although the X-ray production by transition radiation is at least three orders of magnitude brighter on a *per electron basis*, storage rings have a higher average beam current, and this advantage is lost.

The power density required for lithography is between 10 to 100 mW/cm$^2$. Larger values than 100 mW/cm$^2$ will result in excessive heating and possible damage to the X-ray mask. Lower values than 10 mW/cm$^2$ will result in prohibitively long exposure times.

Exposure times depend upon resist sensitivity that can vary between 10 mj/cm$^2$ to 1000 mj/cm$^2$. Higher resolution resist usually requires higher energy deposition. For example, polymethylmethacrylate (PGMA) photoresist with 0.25 $\mu$m resolution or better requires 230 mj/cm$^2$. This experimental resist would require 15 mW/cm$^2$ for 15 second exposures.

In the prior art, transition radiators have produced only fluxes of 0.7 mW (see M. A. Piestrup, M. J. Moran, B. L. Berman, P. Pianetta, D. Seligson, "Transition radiation as an X-ray source for lithography," SPIE vol. 773, Electron-Beam, X-ray, and Ion-Beam Lithographies, pp. 37–44, 1987). The Lawrence Livermore National Laboratory's (LLNL) electron-position accelerator was utilized to produced a 104-MeV (million electron volts), 44-μA (amperes) electron beam which penetrated a stack of fifteen 1.5-μm-thick aluminum foils generating only 0.7 mW of soft X rays at a peak photon energy of 1.4 keV (kilo-electron volts) with an approximate bandwidth of 100%. Exposure times for the mask and wafer (here in after called the mask-/wafer) were long due to the large area of the X-ray beam and the large distance between the radiator and the mask/wafer (6 m). Since the X ray annulus diverges at $1/\gamma$, after 6 m the area of the annulus is much larger than 6 to 12 cm$^2$ for electron beam energies of 150 MeV and larger. Fluxes of 60 mW exposing area of 6 cm$^2$ or less are needed for a 10 mW/cm$^2$. The conical X-ray pattern emitted from the transition radiator used in this experiment was not uniform and exposed only an annular ring on the photoresist. Thus methods for making the radiation pattern uniform and increasing the X-ray power are needed.

In the prior art it was believed that transition radiation was not adequate for high throughout (high production) of integrated-circuit chips since the exposed area was small and the total power of the transition radiator was small. Wafers of 4 to 6 inches in diameter are used in optical lithography, and it was assumed that transition radiation had to expose equivalent size areas: the total X-ray flux had to cover the entire area of the 4 to 6 inch wafers and still maintain a minimum of 10 mW/cm$^2$ average power. Since the total from the transition radiator is limited, the number of chips per hour that this source could produce would be small. Thus transition radiation has not been seen as a competitor for X-ray lithography.

In the prior art Holman and others assumed that extremely high currents were needed to generate adequate soft X-ray flux from transition radiators needed for X-ray lithography. Holman suggests a 1 mA, 100 MeV electron beam. This is 100 kW (kilowatts) of power, a difficult electron-beam power to achieve. In addition, the foils will melt as such a high current and the radiation hazard generated by such a high-current electron beam is appreciable. As Holman, himself says, "The assumption of beam uniformity is optimistic, as is the 1 mA current." Richard Holman, Intel Corporation, "X-ray lithography using broadband sources" (1986).

3. Prior Art: Transition Radiation Design

X-rays are produced by transition radiation when high-energy electrons cross the interface between two media or between vacuum and a medium. The photon production for a single interface is small; however, by stacking a number of foils, the yield can be greatly increased. In most applications, individual foils separated by vacuum are used to reduce re-absorption of the X rays in the interventing medium.

The photon production from transition radiation is intimately related to the thickness of an individual foil, not only due to re-absorption of the emitted radiation in the foils themselves, but also because a minimum thickness (known as the formation length) is needed for photon production. Re-absorption can be minimized by making the foils as thin as possible; however, if they are made thinner than the formation length, the photon production will drop. Thus, there is an optimum foil thickness that balances production with re-absorption, giving a maximum photon yield. For soft X rays, the thicknesses used in previous studies were between 0.5 and 5 μm.

In the prior art, the radiator would be constructed of thin foils of thickness $l_2$ and plasma frequency $\omega_2$ separated by either a gas or vacuum of thickness $l_1$ and plasma frequency $\omega_1$ (for the gas). See M. A. Piestrup, J. O. Kephart, H. Park, R. K. Klein, R. H. Pantell, P. J. Ebert, M. J. Moran, B. A. Dahling, and B. L. Berman, "Measurement of transition radiation from medium-energy electrons," Phys. Rev. A vol. 32, pp. 917–927, Aug. 1985. For the usual case, when $l_1 > > l_2$ and $\omega_1 > > \omega_2$, then the radiation is emitted at frequencies $< \gamma\omega_2$. This frequency represents a cutoff frequency above which the radiation falls dramatically. Since the plasma frequency of a material is proportional to the square root of its density, this cutoff frequency is proportional to the square root of the foil density. For beryllium foils, $\omega_2 = 24.5$ eV, and a $\gamma$ of 50 to 100 is needed for adequate photon production at 1.5 keV.

The foil thickness is obtained from M. L. Cherry, D. Muller, and T. A. Prince, "Transition Radiation from relativistic electrons in periodic radiators," Phys. Rev. D., vol. 10, pp. 3594–3607, Dec. 1974. For photons to be generated the foil thickness, $l_2$, and foil spacing, $l_1$, must be on the same order of magnitude or greater than their "formation lengths" which are given approximately by:

$$Z_2 = \frac{4\lambda}{\frac{2}{\gamma^2} + \frac{\omega_2^2}{\omega^2}}, \qquad (1)$$

the foil spacing:

$$Z_1 = \frac{4\lambda}{\frac{2}{\gamma^2} + \frac{\omega_1^2}{\omega^2}}, \qquad (2)$$

where $\omega$ is the angular frequency of the radiation, $\lambda = c/\omega$, $\omega_i (i=1,2)$ are the plasma frequencies of the interfoil gas and the foil material, respectively. In most cases, the foils are in a vacuum and $\omega_1 = 0$.

In the prior art, the number of foils, M, that can be used is limited by absorption in the foils; the maximum number is:

$$M \leq \frac{2}{\mu l_2} \qquad (3)$$

where $\mu$ is the X-ray absorption coefficient of the foil material and $l_2$ is the thickness of the foil. The photons produced at the first few foils will be absorbed by the succeeding foils. This is a fundamental limitation of the number of foils of a prior art transition radiator. For example, using this criterion only 35 foils of 1.5 μm beryllium can be used to produce 1.5 keV X-rays.

The soft X rays from a number of transition radiators using a moderate energy electron beam (17 to 300 MeV) are in the region of the spectrum needed for lithography. Several spectra are compared in FIG. 2. The spectra match the desired photon energy range for the mask/resist absorption band between 800 eV and 3.5 keV.

The beryllium foil stack is by far the most intense soft X-ray source, followed by aluminum. Unfortunately, these foils are extremely toxic and if atomized by heating, would contaminate the accelerator. Hence, no beryllium foils have been used at high currents. In the prior art, only extremely low currents have been used to measure the spectra of beryllium stacks (see for example, M. A. Piestrup, J. O. Kephart, H. Park, R. K. Klein, R. H. Pantell, P. J. Ebert, M. J. Moran, B. A. Dahling, and B. L. Berman, "Measurement of transition radiation from medium-energy electrons," Phys. Rev. A vol. 32, pp. 917-927, Aug. 1985).

Previously the peak X-ray flux, photons/(electron-eV), was optimized at a particular photon energy, $\omega_0$, by setting:

$$I_2 = 1.32 \, Z_2(\omega_0) \tag{4}$$

$$M = \frac{2}{\mu_2(\omega_0) l_2(\omega_0)} \tag{5}$$

This is demonstrated in FIG. 3. For the cases shown, the spectra are optimized at 700, 1200, and 1800 eV. The electron beam energy is 150 MeV. The peak flux, number of foils, and foil thickness increase with increasing $\omega_0$. The spectrum grows and slides to the right toward the harder X-ray region of the spectrum. Unfortunately, the less desirable, harder X-rays above 3 keV increase, while the more desirable, soft X rays decrease. The soft X rays are more absorbed in the photoresist while the harder X rays pass through both the mask absorber and substrate decreasing the contrast of the circuit image.

4. Prior Art: Methods of Increasing the X-ray Power

In the prior art the maximum power produced by the transition radiator is limited by the maximum number of foils and the maximum electron-beam power that foils can withstand without melting or distorting. For example as suggested theoretically in M. A. Piestrup, J. O. Kephart, H. Park, R. K. Klein, R. H. Pantell, P. J. Ebert, M. J. Moran, B. A. Dahling, and B. L. Berman, "Measurement of transition radiation from medium-energy electrons," Phys. Rev. A vol. 32, pp. 917-927, Aug. 1985, a maximum number of 60 beryllium foils would be necessary to produce 12.5 mW/cm$^2$ at a distance of 1 m from the foil stack. This would require a 100-MeV, 600-$\mu$A electron beam. The stack would heat to 960° C. for a 2-mm diameter electron beam. This is an extremely high-power electron beam and the foils are unlikely to survive such high temperatures. Increasing the electron-beam power would result in the melting of the foils. Other methods of increasing the total output power are needed to give adequate X-ray flux for lithography and prevent the melting of the foils.

A prior art method of increasing the total X-ray power uses the concept of allowing X-rays to escape without striking the foils. This has been tried by M. A. Piestrup, J. O. Kephart, H. Park, R. K. Klein, R. H. Pantell, P. J. Ebert, M. J. Moran, B. A. Dahling, and B. L. Berman, "Measurement of transition radiation from medium-energy electrons," Phys. Rev. A vol. 32, pp. 917-927, Aug. 1985. In this scheme, the stack is "split in half" allowing half of the X-ray cone to escape. The electron beam is steered by approximately one beam diameter into the transverse dimension of the foil stack. The X-rays generated in the upper half of the radiation cone will leave the stack, while X-rays in the lower half will be emitted largely from the last few foils (of total thickness $2/\mu l_2$). The spacing between the foils is adjusted, limiting the number of foils per unit length, so that the number of foils encountered by a photon in the upper half plane is less than $M = 2/\mu_2 l_2$. From simple geometric considerations, the spacing between the foils should be $L \approx d/M\theta \approx \mu_2 l_2 \gamma d/2$, where d is the diameter of the electron beam and $l_1 \gg l_2$. The split stack has the disadvantage that approximately one half of the radiation is lost in the foils and the resulting pattern is not symmetrical.

5. Prior Art: X-ray Beam Uniformity

The transition X rays are emitted in a narrow cone with an apex angle of $\theta = 1/\gamma$ where $\gamma = E/E_0$, E is the electron energy and $E_0$ is its rest energy. The resulting X-ray pattern is a ring or annulus when it strikes the wafer and mask. This is shown graphically in FIG. 1. For example at 50 MeV the apex angle is 10 mr (0.6°). The diameter of the annulus would be only 1.2 cm at a distance of 1.3 meters from the stack. Thus the radiation is almost laser-like at these electron-beam energies, but the radiation pattern is not uniform, having a hole in the center of the beam.

For lithography the X-ray beam must have a uniform cross-sectional intensity at the mask and wafer for the exposure to be uniform. Variations across the X-ray beam should be less than ±5%. Since the radiation pattern from transition radiation is an annulus, some method of collimation and radiation re-distribution must be achieved. As discussed by J. Maldonado in his paper entitled "X-ray Lithography, Where It Is Now, and Where Is It Going" (paper presented at the 2nd Workshop on Radiation Induced and on Processing Related Electrically Active Defects on Semiconductor-Insulator Systems, September 1989, MCNC, N.C. to be published), "Due to this geometry (the transition radiation annulus), there is concern on whether the required (X-ray) beam uniformity for XRL (X-ray Lithography) could be achieved."

In patent application Ser. No. 7/378,907, filed July 12, 1989, entitled "A Focused X-ray Source," by M. A. Piestrup, D. G. Boyers, C. I. Pincus, and P. Maccagno cylindrical optics are used to collect the annular X rays into a single millimeter spot. The apparatus has a transition radiation source which generates X-rays in a conical radiation pattern. An electron beam usually housed in a vacuum pipe strikes the thin foils, thus generating the X-rays, which are then collected by the optics which focus the radiation at an appreciable distance from the radiator.

In one embodiment of patent application Ser. No. 7/378,907, the optic consists of a smooth-bore tube composed of a solid such as metal, glass, or quartz. X-ray focusing is achieved by having the X-rays strike the surface of the tube at a grazing angle such that the X-rays are almost entirely reflected. The nature of a diverging cone traversing down the axis of a cylinder of revolution and intersecting the cylinder is such that an appreciable amount of the radiation will be reflected and focused.

The focal spot dimensions are on the order of the emitting electron-beam dimensions at the transition radiation foil stack. Spots of 0.3 to 2 mm diameter have been obtained at a distance of 1.35 meters from a transition radiator. Smaller spot sizes are possible. These sizes result in a large increase in the intensity at the focus.

In the prior art, the X rays produced by a synchrotron source are emitted in a vertically narrow beam smeared in the horizontal plane. The analogy between a search light and this source can be made: the optical photons emitted from a search light come out in a narrow beam that is rotated horizontally, resulting the beam smeared in the horizontal plane but collimated in the vertical plane. The same occurs for the synchrotron source. In the synchrotron source the X rays are picked up by a small mirror which deflects them out to the mask and wafer. The area illuminated is a narrow rectangle measuring, for example, 2 mm vertically, and 2 cm horizontally. Thus the entire wafer is not illuminated. To accomplish this the X-ray mirror must be mechanically scanned across the mask and wafer. This adds to the angular emittance of the X-ray beam and increases the shadowing of the mask circuit elements on the wafer, resulting in increased blurring. The small rectangular, high-intensity X-ray beam can cause localized heating of the mask, resulting in the mask distorting as the beam is scanned.

6. Prior Art: Transporting and Condensing X-rays for Lithography

As stated by A. Heuberger in his paper "X-ray Lithography," Solid State Technology, Feb. 1986, "There are no imaging optics available for X rays which possess a useful efficiency, which means that a condenser for homogeneous illumination of the wafer is not realizable . . . the lack of a useful optics such as lenses, in this wavelength range means that the radiation must be used in the same form (i.e., wavelength distribution and geometrical characteristics) as that emitted from a given X-ray source." Laser plasmas are highly divergent point sources while synchrotron sources are collimated in only one plane and require aperturing in the other plane. The lack of collimation and collection means that all sources with finite divergence must be close to the source. In the case of plasma sources this means that they must be within 10 to 20 cm of the radiator. For synchrotron sources the distance can be much greater 3 to 10 meters depending upon the electron-beam energy).

In the prior art no one has realized a source that is of small divergence (partially collimated). The prior art sources of laser plasma, X-ray tubes (impact sources), and synchrotron sources because of their divergence do not lend themselves to existing X-ray optics which could be used to collect and transport the X-rays. In patent application Ser. No. 7/378,907, filed July 12, 1989, entitled "A Focused X-ray Source," by M. A. Piestrup, D. G. Boyers, C. I. Pincus, and P. Maccagno it was recognized for the first time that transition radiation was an ideal source for cylindrical X-ray optics. The source has a low divergence radiation pattern that is almost laser-like. Its radial axial mode (annulus) is ideal for surface-of-revolution optics.

For synchrotron and transition radiation sources transportation of the X rays to the mask target area is important for several reasons. The electron beam generates other ionizing radiation which can be harmful to both the lithography process and to the operators. Thus there must be adequate shielding between the electron beam and the mask target. Adequate shielding may require several meters of concrete and neutron shielding (e.g. parafin wax). The power density of the X rays must not drop appreciably as it is being transported and additional geometrical distortion due to high divergence of the X rays must not be introduced in the process of collection and transportation. Ideally the optic would not only transport the beam but would collect most of the radiation being generated.

7. Prior Art: Multiple Stations

In the prior art synchrotron sources have been made less expensive by increasing the number of X-ray beamlines or "stations" around the storage ring. Synchrotron radiation is emitted in the plane of the electron-beams orbit; thus, photon beamlines oriented tangentially to the curve of the electron beam and in the plane of the orbit will intercept much of the X-ray emission. In compact-ring designs, 10 to 20 stations are allowed per ring. For transition radiators only one radiator has been used.

A 16-station synchrotron-based system is projected to have a per station cost of $4-5M and a total system cost of $64M to $80M. However, IBM and others have identified the need for a much smaller system (comprising one to several stations) with the same per station cost but a much lower total system cost. This would enable companies to enter the X-ray lithography business with an initial investment of $4-6M and add additional capacity in discrete increments. Many U.S. companies are discouraged from entry by the extraordinarily high cost of X-ray lithography systems. Currently, laser-plasma source X-ray lithography systems selling for $4-5M are considered to be serious contenders for this segment of the market.

Laser plasma and electron impact sources are inherent single-station sources and cannot be expanded. An optimum source would be one that was approximately the same cost as a laser-plasma system but the number of stations could be increased as the need for higher integrated-circuit production increases.

SUMMARY OF THE INVENTION

The present invention provides an X-ray source which is brighter than previous transition radiators and has a uniform X-ray pattern. The electron-beam current and energy needed for this present invention is available from current linacs and is not excessively large, unlike previous predictions in the prior art. In addition an X-ray-beam area is achieved which matches the mask-/wafer target area. The present invention is designed to provide uniform, high-intensity, soft X-ray radiation for the exposure of photoresist on silicon wafers. This invention provides a less expensive alternate to synchrotron radiation and has better technical characteristics when compared to the laser plasma X-ray lithography system.

Two embodiments are given which correspond to two regions of electron beam energies: moderate electron-beam energies (100 MeV to 250 MeV), and low energies (25 MeV to 100 MeV). The distinction between these two cases is primarily that the lower electron-beam energies may need optics to collect and translate the X rays to the mask/wafer target. If the electron beam energy is sufficiently high (E>100 MeV) the conical X-ray annulus will match or be smaller than the mask/wafer target area, and the distance between the foil stack and the mask/wafer target will be sufficiently large for adequate radiation shielding and magnetic deflection of the electron beam (for separation of the electrons from the X rays). Lower electron beam energies (E<100 MeV) will require collection optics to collect and translate the X rays to the mask/wafer target in order to have adequate spacing for radiation shielding and magnetic deflection of the electron beam. Optics may also be used in the high energy case for more efficient collection of the entire conical X-ray annulus, and for uniform illumination of the mask-/wafer target area.

The present invention has demonstrated a performance of 15.2 milliwatts using only a 7-kW electron-beam power and has produced experimental lithographs with a circuit element resolution of 0.5 micron. This higher flux was obtained by using beryllium foils, increasing the electron-beam energy (105 to 245 MeV), and bringing the foil stack and mask/wafer closer together (from 6 m to 3 m). An additional factor of 3 can be achieved by using multiple stacks as described in this patent. A total of 100 mW can be achieved with a power density of 10 to 20 mW/cm$^2$ using electron-beam powers of 10 to 20 kW.

With the present invention the following improvements make the transition radiation a viable source for X-ray lithography: (1) foil parameters, foil to mask spacing and electron-beam energy are selected for increased total power and for optimum spectral content to achieve high-contrast ratio for exposed pattern on the photoresist (2) higher X-ray power density is achieved by increasing the electron-beam energy, shortening the radiator-to-mask distance, and increasing the electron-beam current coupled with cooling the foil stack (3) higher total X-ray power is achieved by increasing the number of foils in the electron beam utilizing novel foil stack geometries, stack spacing or magnetic deflection between foil stacks; (4) X-ray beam uniformity is achieved by using changes in the electron-beam angular spread and area at the radiator, novel X-ray optics, X-ray beam scanning, and electron-beam scanning, (5) multiple station operation is achieved by magnetic deflection, special foil stack geometries, and additional foil stacks.

1. Parameter Selection

In accordance with preferred embodiments of the invention the parameters of foil thickness, foil material, electron-beam energy and radiator-to-mask distance, $Z_0$, are selected (1) to achieve maximum total X-ray power in the X-ray frequency range of optimum resist sensitivity and maximum image contrast; (2) to achieve the optimum spectral content for high-contrast ratio for the exposed pattern on the photoresist; and (3) to achieve an area of exposure of approximately 6 to 12 cm$^2$.

1.1 Foil material, thickness and number selection

The foil thickness, number, and material are selected to achieve maximum photon production and optimum spectral content for high-contrast ratio for the exposed pattern on the photoresist. The foil thickness, foil number, and material are selected to maximize photon production; however, these parameters, along with electron-beam energy, also determine spectral shape, and distribution. In the present invention the spectrum is optimized by selecting foil thicknesses optimum for photon energies on the low photon-energy range of the desired spectrum unlike the prior art which was optimized at the center of the desired spectrum. The number of photons is then increased above $M = 2/\mu_2 l_2$, causing the spectrum to increase in total photons. As the number of foils is increased the portion of the hard X rays also increase. We therefore limit the number of foils to the point where the increased number of hard X-rays will degrade the contrast of the circuit image on the wafer. The number of foils is limited to approximately 50 foils of 1-$\mu$m beryllium. The result is an increase in total power over the prior art and a more optimum spectrum for best contrast.

In the present invention beryllium is found experimentally to give the most soft X rays for lithography. The toxic hazards of beryllium are reduced by the small amount of beryllium used.

1.2 Electron Beam Energy

The maximum field size with the present mask technology is limited due to mask distortion, and handling considerations to be about 6 to 12 cm$^2$. The current maximum exposed area is limited by the registration of the mask with the various levels of previous resist patterning to be approximately 2.54 cm (or 1 inch) diameter. This limit is primarily due to existing methods of mask alignment whose registration is no better than 0.25 $\mu$m. As discussed in the previously cited Maldonado paper, "The maximum field size . . . is . . . still limited due to mask distortion, and handling considerations in the relatively thin membranes utilized for mask substrates." Thus, unlike what was thought in the prior art, the small X-ray-beam spot size produced by transition radiation is adequate for achieving moderate throughput (chips/hour) and is not a hindrance in its use as a source for X-ray lithography. In the present invention the electron-beam energy and distance from the mask to the source is adjusted so that the exposed area is roughly 6 to 12 cm$^2$. The knowledge that the required exposure area was limited was not discussed or described in the prior art concerning transition radiation as an X-ray source for lithography. This resulted in transition radiation being rejected as a possible source because of the small area of illumination. If the total transition radiation X-ray power is distributed over the entire wafer (3" to 6" in diameter) the power density would be too low and would result in a low rate of production of integrated circuit.

2. X-ray Power Increase by Novel Foil Cooling Techniques

In accordance with the present invention the X-ray flux can be increased by increasing the electron-beam current and cooling the foils by either convection or conduction methods or redistribution of the heat by foil-stack rotation or electron-beam scanning. In the prior art no such methods were suggested.

One embodiment for increasing the total output power of the transition radiator is to increase the total electron-beam current through the foil stack and to distribute the heat by rotating the foils in the electron beam. This increases the area that the electron beam strikes, thus distributing the total thermal losses, and allowing larger electron-beam currents to be used.

3. X-ray Power Increase by Novel Geometries

In the present invention, the total power of a transition radiator can be dramatically increased by arranging a number of foil stacks or individual foils such that the entire conical radiation pattern of transition radiator misses succeeding foil stack or foils. There are two embodiments for increasing the X-ray power by increasing the effective number of foils: (1) increase the number of foils by spacing the foils or foil stacks such that the naturally occurring radiation cone from the foils upstream will miss the succeeding foils and (2) magnetically adjust the angle of the electron beam in each foil stack such that the X-ray cone misses succeeding stacks. Unlike the prior art, the entire conical X-ray annulus is used.

In the first embodiment of this idea spacing the foils or foil stacks at large enough distances, the cone of radiation will miss succeeding stacks and the total output power will increase linearly with the number of foils. The diameter of succeeding stacks will be limited to approximately twice the electron-beam diameter. Each stack has a maximum number of foils based on the absorption criterion of $M \simeq 2/\mu_2 l_2$. The resulting annuli will add in a "bull's-eye" like pattern. This bull's-eye pattern is also useful for making the radiation pattern more uniform.

In the second embodiment of this idea the electron beam is bent at each foil stack such that the radiation pattern misses the succeeding foil stacks. The angle that the electron beam makes at each stack can be adjusted such that the radiation cones all add concentrically. This results in an N-fold increase in X-ray power, where N is the number of stacks. As in the first embodiment, the output pattern can be designed with the added benefit that the power density is more uniform across the mask and wafer.

4. Collection and Transportation of the Transition X-rays

Transition radiation's unique radial mode is ideally suited for X-ray surface-of-revolution optics. The low divergence cone of transition radiation can be easily focused by grazing-angle optics. No other known X-ray source allows almost the entire emitted radiation pattern to be collected. Synchrotron radiators, conventional X-ray tube bremsstrahlung, and laser-plasma sources cannot have their entire radiation patterns focused.

The surface-of-revolution optics invented for transition radiation discussed in patent application Ser. No. 7/378,907 can do three things when used in an X-ray lithography system: (1) it permits the collimation and concentration of the X-rays at the mask target area; (2) it can achieve X-ray beam uniformity; and (3) it permits the X-rays to be utilized at a long distance from the transition radiator.

Since the radiation cone is diverging at an angle of approximately $\theta = 1/\gamma$, after a short distance, depending upon the electron-beam energy, the radiation annulus will be unacceptably large (greater than 6 to 12 cm$^2$). although it is possible to use the source as it comes directly off the radiator by bringing the mask and wafer close to the radiator (1 to 3 meters). An optic which would collimate and redirect the radiation cone over a long distance (3 to 6 meters) would permit room for radiation shielding and electron optics for directing the electron beam away from the X-ray beam.

In addition, much of the X-ray power is at larger cone angles than $\theta = 1/\gamma$; thus X-rays outside the $1/\gamma$ cone will not be used with an uncollimated S-ray beam because the power density is lower outside the $1/\gamma$ cone. Although the power density drops dramatically after $2/\gamma$, there is radiation emitted out to:

$$\theta_{max} = (1/\gamma^2 = (\omega_2/\omega)^2)^{\frac{1}{2}} \quad (6)$$

For large $\gamma$, then $\theta_{max} \simeq \omega_2/\omega$. For beryllium foils $\omega_2 = 26.1$ eV, for $\omega = 1500$ eV, $\theta_{max} = 18$ mR. As we shall see, we need to collect as much of the radiation cone out to this angle as possible for electron beams of energies greater than 50 MeV.

In the new art a specially designed optic of either a surface-of-revolution or Fresnel lens is used to collect, collimate, and transport the X-rays. The optics are designed to capture almost the entire radiation cone and direct it toward the mask target area. The benefit is that a relatively moderate power source of X rays with an unusual conical radiation pattern can be made to deliver intense, collimated X-rays to a designated wafer target area.

5. X-ray Beam Uniformity

Conventional thinking would suggest that such a source is highly inappropriate for lithographic applications, which demand very uniform illumination ($\pm 5\%$ over a 6 cm$^2$ to 12 cm$^2$ disk). However, in the present invention the conical X-ray annulus is redistributed by five methods: (1) the electron-beam divergence is changed so that the annulus is smeared and the hole is filled, (2) the time average annular radiation pattern is smeared and made uniform by scanning the X-ray beam by grazing incidence mirror, (3) the time average annular radiation pattern is smeared and made uniform by scanning the electron beam across the radiator, (4) the mask and wafer are moved such that the time average power across the mask and wafer target areas are uniform (5) a surface-of-revolution lens is constructed using a computer-aided design such that the radiation arriving at the mask plane is uniform.

We have used electron-beam optics to fill in the conical X-ray annulus resulting in a more uniform power density across the X-ray beam. This was accomplished by changing the direction size and shape of the electron beam where it struck the foil stack. Prior art transition radiators have not used this concept.

In another embodiment of the present invention the electron beam is also used to alter the direction of the radiation pattern. The electron beam is steered through the foil stack so that the direction of the emitted X rays can be much different than that of the original direction of the electron beam and off axis to the axis of the foil stack. This can be used to scan the electron beam to alter the time-average power striking the mask/wafer target area.

In another embodiment, the average area covered by the conical X-ray annulus is changed by oscillating a grazing-angle output mirror. This smears the X rays across the mask and silicon wafer so that on a time average basis a uniform X-ray intensity is achieved.

None of these embodiments have been attempted using transition radiation in the prior art.

6. Multiple Station Operation

To decrease the overall production costs, additional foil stacks are added to the electron beam, each with an X-ray beamline and a mask and wafer alignment system. Thus the cost per station is reduced by sharing the linac and the electron beam. This can be done because the electron beam is only slightly perturbed as it passes through the foil stacks. The electrons are elastic-scattered and experience some energy loss as they pass through the foils. However this scattering and loss are minimal for a finite number of foils.

BRIEF DESCRIPTION OF THE DRAWINGS

FIG. 6 shows the image of the transition radiation annulus on a resist coated silicon wafer.

FIG. 14 shows the geometrical layout of the radiator and mask and wafer showing the effects of overlay error and penumbral blur.

DESCRIPTION OF THE PREFERRED EMBODIMENTS

1. Simple Embodiments: Single Station Lithography

Two single-station embodiments are considered here: one with moderate energy electron-beam (100 to 250 MeV), and another with low energy electron beam (25 to 100 MeV). The moderate energy case is the simplest requiring little or no optics to achieve a spot size at the mask/wafer of 6 to 12 cm$^2$ (with radiator to mask/wafer of 2 to 3 meters, adequate distance for radiation shielding). The low energy case may require collection optics to concentrate the X-rays to a 6 to 12 cm$^2$ spot, but is less expensive because of the smaller linac. This again allows a radiator to mask/wafer distance of 2 to 3 meters.

1. Moderate Energy (100 to 250 MeV) Embodiment

Figure 4:
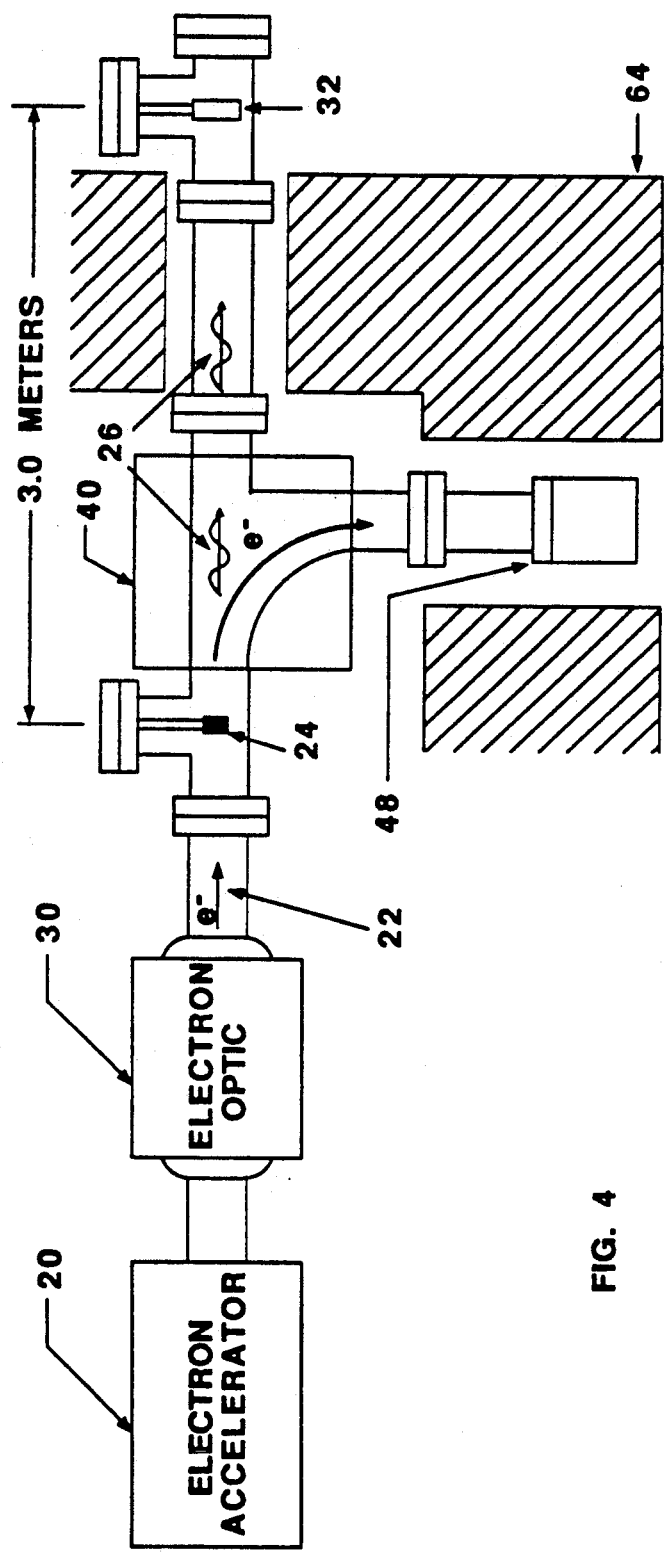
FIG. 4 shows a simple embodiment of a single station lithography system using a transition radiator.

As seen in FIG. 4, a simple embodiment the X-ray lithography system includes an accelerator 20, which emits a well collimated electron beam 22 which passes through a magnetic cylindrical lens or a quadrapole focusing system 30 and then through the foil stack 24 where X-ray transition radiation is generated. The X rays 26 continue on to the mask and wafer 32. The electrons are bent out of the way by a beam dump magnet 40 and into a beam dump hole 48 where they are absorbed. The electron-beam diameter is adjusted by the magnetic cylindrical lens 30 so that the central hole of the emitted X-ray radiation annulus is filled, where it illuminates the target area on the mask and wafer. This results in the X-ray radiation pattern being uniform so that there is uniform exposure of the photoresist.

Using the embodiment of FIG. 4, the inventors have exposed photoresist-coated silicon wafers using soft X rays from a transition radiation source. The experiments were performed at the Saskatchewan Accelerator Laboratory (SAL) in Canada using a 137 to 245 MeV accelerator with beam currents as high as 58 μA. The mask and silicon wafer 32 were placed 3.0 meters from the transition radiator 24.

Figure 5:
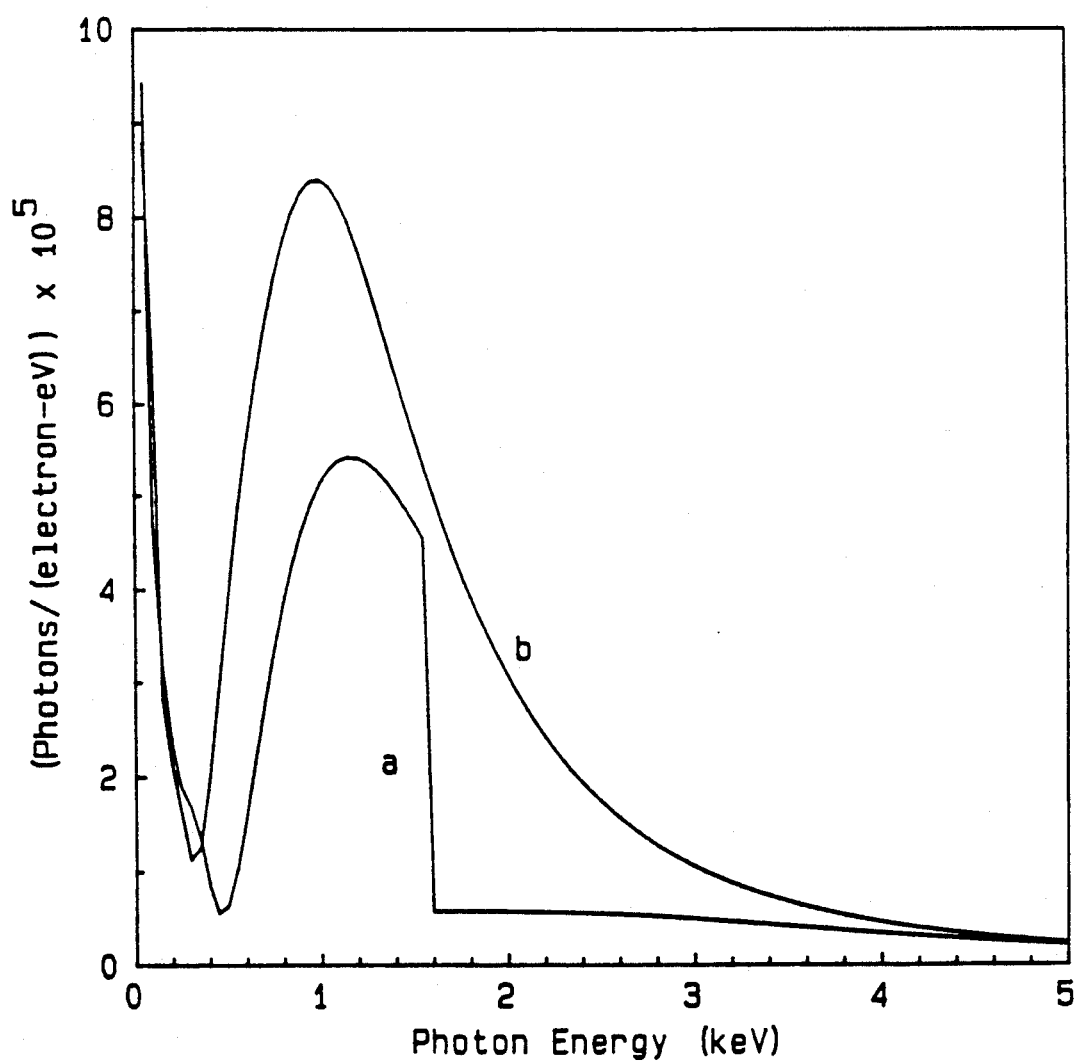
FIG. 5 shows the theoretical spectrum for a transition radiator composed of (a) 12 foils of 1.0-μm aluminum using a 184 MeV electron beam and (b) 25 foils of 1.0-μm beryllium using a 245 MeV electron beam.

Two transition radiators were used: one with ten foils of 1-μm aluminum and one with twenty-five foils of 1-μm beryllium. The total number of beryllium foils was limited due to cost considerations only. Fifty foils would have given more flux. The theoretical spectra for the two stacks using a 184 electron beam for the aluminum stack and a 245 MeV beam for the beryllium are shown in FIG. 5. Integrating over photon energy for 500 eV to 4.0 keV we predicted the total power obtained from the radiator. The predicted powers for the six electron-beam energies are given in Table I.

To measure the total X-ray flux we utilized two planar-diode detectors. The photodiodes were placed at the end of the beam pipe (right hand side of FIG. 4). One photodiode consists of a 74-mm-diameter beryllium photocathode plated with 1500 Å of aluminum, another photodiode had a stainless steel photocathode. From D. Seligion, L. Par, P. King, P. Pianetta, Nuc. Instr. and Meths., A266, p. 612 (1988) we estimated the efficiencies in the bandwidth of the source. Using the measured currents from the measured currents from the diodes and these efficiencies, we obtained the total power generated from the radiator.

Table I gives the X-ray emission that was measured with this arrangement. The measured values agree with the theoretical predictions within experimental error and knowledge of the electron-beam current. The maximum power measured was 15.2 mW, the highest X-ray flux ever obtained from such a radiator (22 times larger than the prior art work). Maximum current through the radiator was 58 μA. See Table I.

TABLE I

X-ray Production from Aluminum and Beryllium Foil Stacks

| Energy (MeV) | Linac Average Current (μA) | Estimated Theoretical Power (mW) | Measured X-ray Power (mW) |
|---|---|---|---|
| 135 | 46.0 | 4.0 | 3.8 |
| 150 | 35 | 3.3 | 3.1 |
| 180 | 46.8 | 5.2 | 4.0 |
| 184 | 57.6 | 6.5 | 8.0 |
| 210 | 18 | 2.3 | 2.9 |
| 217 | 21.6 | 2.7 | 2.8 |
| 247* | 37.0 | 12.3 | 15.2 |

Radiator was 10 foils of 1 μm aluminum;
*Radiator was 25 foils of 1 μm beryllium For making circuit patterns on silicon wafers we used Shipley MICROPOSIT ECX-1029 photoresist throughout the SAL experiments. The photoresist was coated on 4-inch diameter silicon wafers. This resist has a required energy dose per unit area for exposure of 230 mj/cm$^2$ (measured with a tungsten source). Two test masks were used. One from Hewlett-Packard (HP) Corporation and another from Intel Corporation. Both had submicron resolution. The Intel mask comprised a gold absorber layer and boron nitride substrate. The boron nitride is deposited on a silicon wafer which is subsequently etched to produce a silicon supporting frame.

The shortest time for a mask and wafer exposure was 120 S (seconds) for complete exposure of 6 cm$^2$ of wafer area. FIG. 6 shows the image of the X-ray beam spot size at a distance of 3 meters from the radiator. The exposure time was 120 S on Shipley MICROPOSIT ECX-1029 (240 mj/cm$^2$) photoresist. The radiator was 25 foils of 1.0 μm beryllium impinged by a 30 μA, 245 MeV electron beam. We reduced the exposed time by a factor of 22 from the value obtained at LLNL. See M. A. Piestrup, M. J. Moran, B. L. Berman, P. Pianetta, D. Seligson, SPIE Electron-Beam, X-ray, and Ion-Beam Lithographies, 773, 37 (1987).

FIG. 6 shows the area of the conical X-ray annulus to be approximately the desired 6 cm$^2$. Thus not only have we produced a large amount of soft X rays with the proper spectrum, but also obtained the desired area of exposure (6 cm$^2$) with adequate radiator-to-mask spacing.

Figure 7:
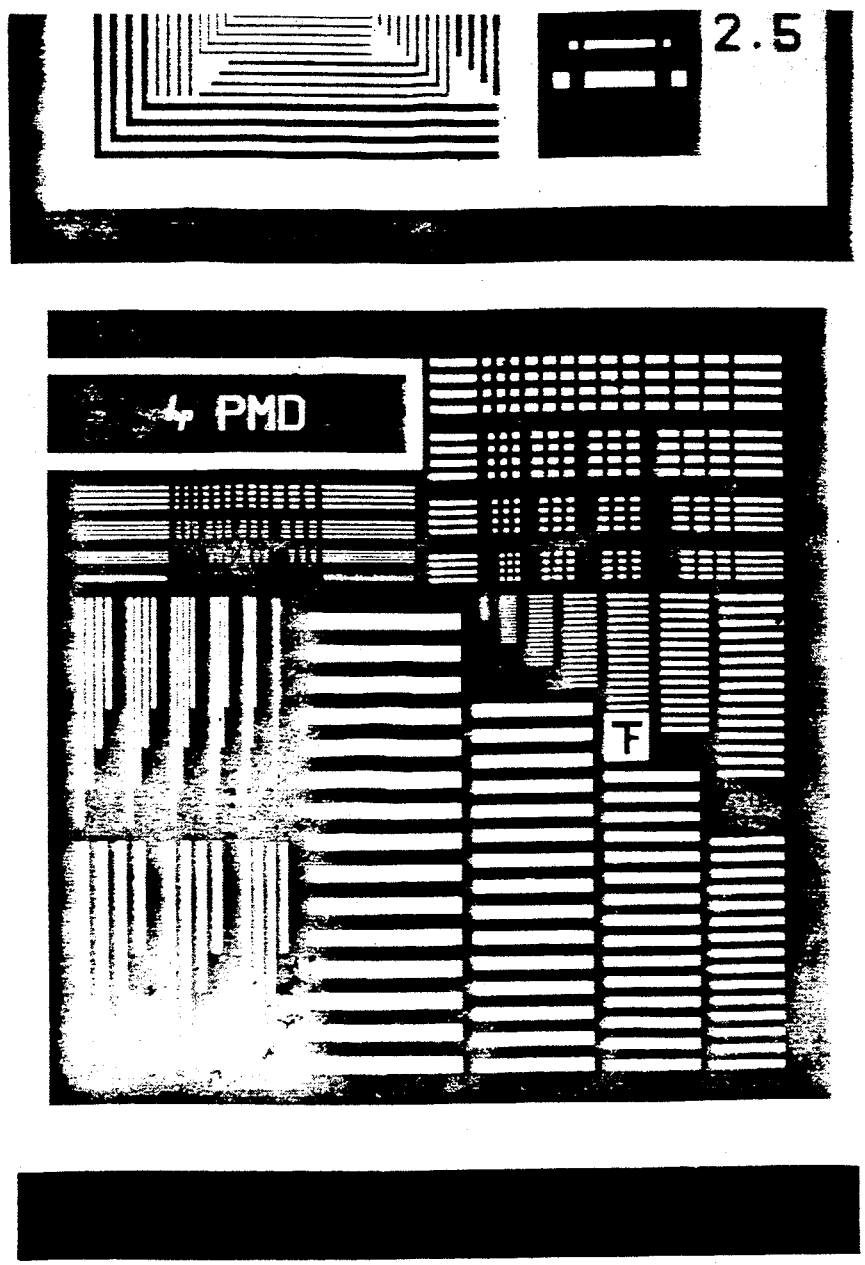
FIG. 7 shows an optical photograph of an X-ray lithograph taken using the transition radiation lithography system shown in FIG. 4.
Figure 8:
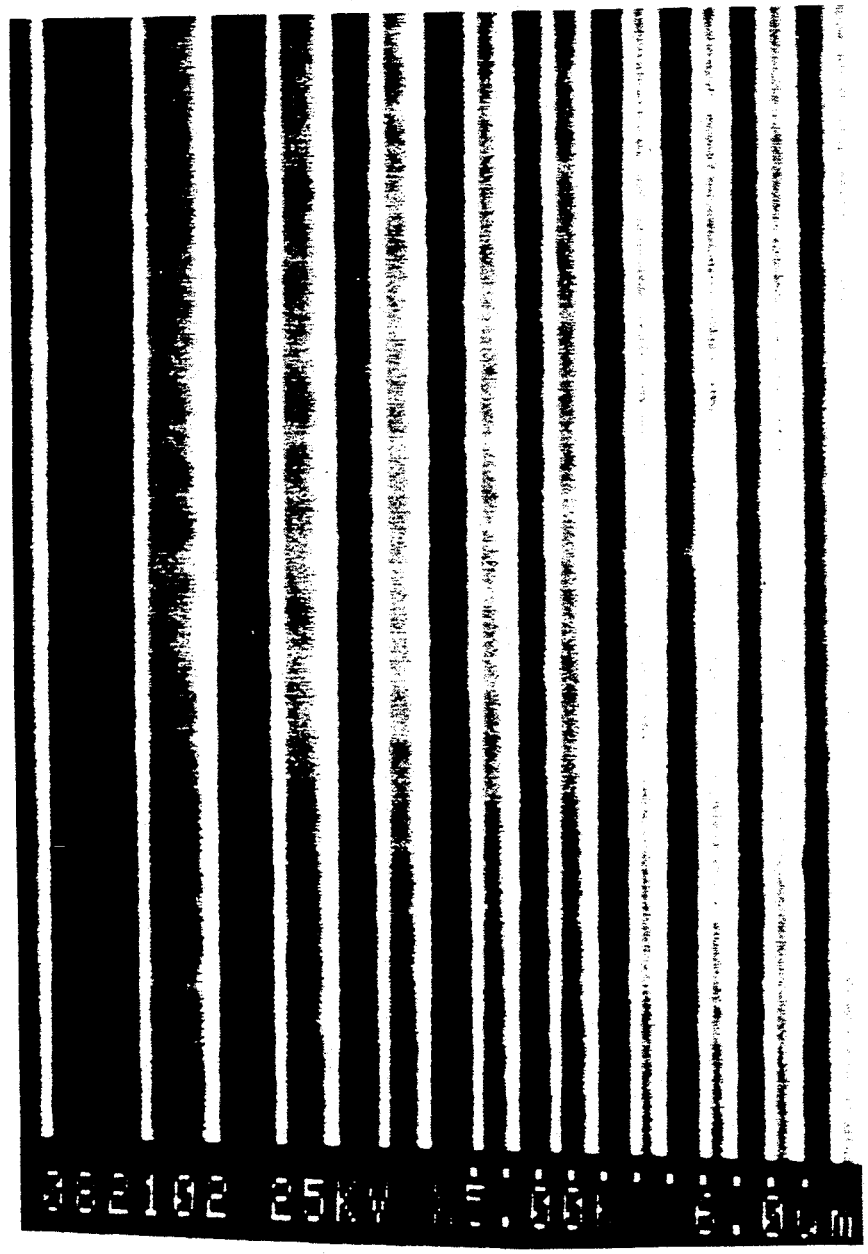
FIG. 8 shows a scanning-electron-microscope photograph of an X-ray lithograph taken using the transition radiation system shown in FIG. 4; the smallest linewidth is 0.5 μm.

Some examples of the lithographs are shown in FIGS. 7 and 8. FIG. 7 shows part of a lithographic exposure made by the HP mask. The photograph was taken under low magnification. The time of exposure for the 11 cm$^2$ area was 300 S. FIG. 8 shows examples of the lithograph obtained using the Intel mask with elements on the order of 0.5 μm or better. The exposure time for this mask was 600 S. The photo was taken using a scanning electron microscope (SEM). The resolution of the finest line is 0.5 μm. Again the total area exposed was 11 cm$^2$. The shortest exposure time was 180 S with the beryllium foil stack.

Other sources of ionizing radiation did not appear to adversely affect the exposure. These were hard X-ray bremsstrahlung, and scattered charged particles and neutrons originating from the foils themselves, from upstream collimators, from backscatter from the beam dump and from any scraping of the electrons off the sides of the beam pipe. A large amount of this kind of radiation would have penetrated the gold absorber, resulting in a loss of resolution. However, this was not the case, and as we seen from the photos clear lithographs were obtained. A grazing incidence mirror can be used to deflect X-rays separating the neutrons and other ionizing radiation from the soft X rays.

No foil stack destruction or distortion was found after 2 hours of penetration by the electron beam with powers varying from 5 to 10 kW. The maximum power of 10.6 kW was the largest power ever put through a radiator. These radiators produced an X-ray flux that is superior to laser-plasma sources and competitive with synchrotron radiators.

1.2 Low Energy (25 to 100 MeV) Embodiment

An X-ray source which utilizes a low-energy (25 to 100 MeV) accelerator is much lower cost device since the accelerator requires only one kylstron (or one modulator)—as opposed to two modulators for the 150 MeV linac. Since the klystron and modulator is approximately ¼ the cost of the linac, this is an appreciable savings.

If the electron beam is less than 150 MeV, then the naturally occurring annulus with no optic would be larger than the desired 6 to 12 cm$^2$ for radiator-to-mask distances larger than 1 meter. A lower electron-beam energy can be used if the cylindrical optic is used which permits the X-rays to be condensed and transported. The surface can be ellipsoidal, paraboloidal, or computer-aided surfaces of revolution. This permits adequate spacing for a beam-dump magnet, beam dump, and shielding between the radiator and the mask and wafer. A minimum spacing between the radiator and the beam dump is about 2 to 3 meters. How the optic works is discussed in section 4. The optic permits the large angle collection of X-rays and thus, since the divergence varies inversely with electron-beam energy, permits the use of lower electron-beam energies.

Figure 9:
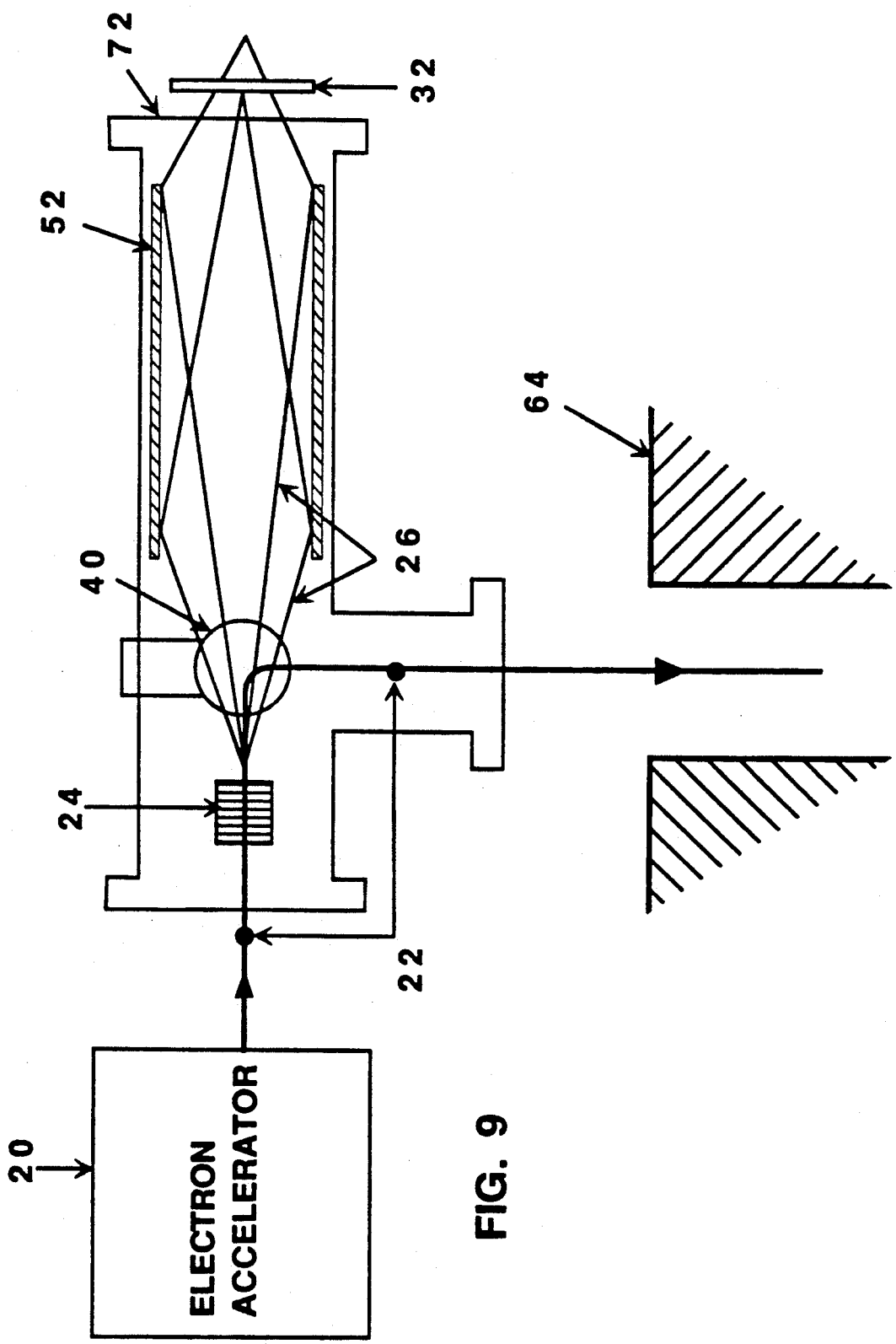
FIG. 9 shows a cylindrical optic for the collection and transport of the soft X-rays to the mask and wafer.

The embodiment using the cylindrical optic is shown in FIG. 9 and includes of an accelerator 20, a transition radiator 24, cylindrical optic 52 and a mask/wafer 32. The accelerator 20 emits a collimated electron beam 22 which passes through a transition radiator 24 which emits X rays 26. The diameter and the length and the position of the cylindrical optic 52 are adjusted so that the X-ray beam area 26 is matched to that of the target area.

The embodiment of FIG. 9 is identical with that of FIG. 4 with the exception of the collection optic, and the lower required electron beam energy. Not shown in FIG. 9 is the beam dump and dump magnet for separating the electrons from the X-rays.

2. Methods of Obtaining X-ray Uniformity at Mask/Wafer

In the field of electron-beam optics, an important concept is that of electron-beam emittance. The emittance is defined as the product of the far-field beam divergence in radians times the beam radius in mm. For a constant electron-beam energy, the emittance remains constant regardless of the electron-beam optic that the electron beam passes through. For example, if the electron-beam emittance is 1 mm-mr, then if the electron beam is focused to 0.5-mm diameter, the far-field divergence will be 2 milliradians. Thus by focusing the electron beam more tightly, the divergence of the electron beam increases. Using such a diverging electron beam in a transition radiator effects the distribution of the X rays. In the present invention, the X-ray annulus is made uniform by focusing the electron beam at the foil stack such that either the electron-beam divergence, $\theta_d$, is on the order of the divergence of the annulus, $\theta_t \simeq 1/\gamma$. Thus:

$$\theta_d \simeq \theta_t \simeq \frac{2}{\gamma} \tag{7}$$

Figure 10:
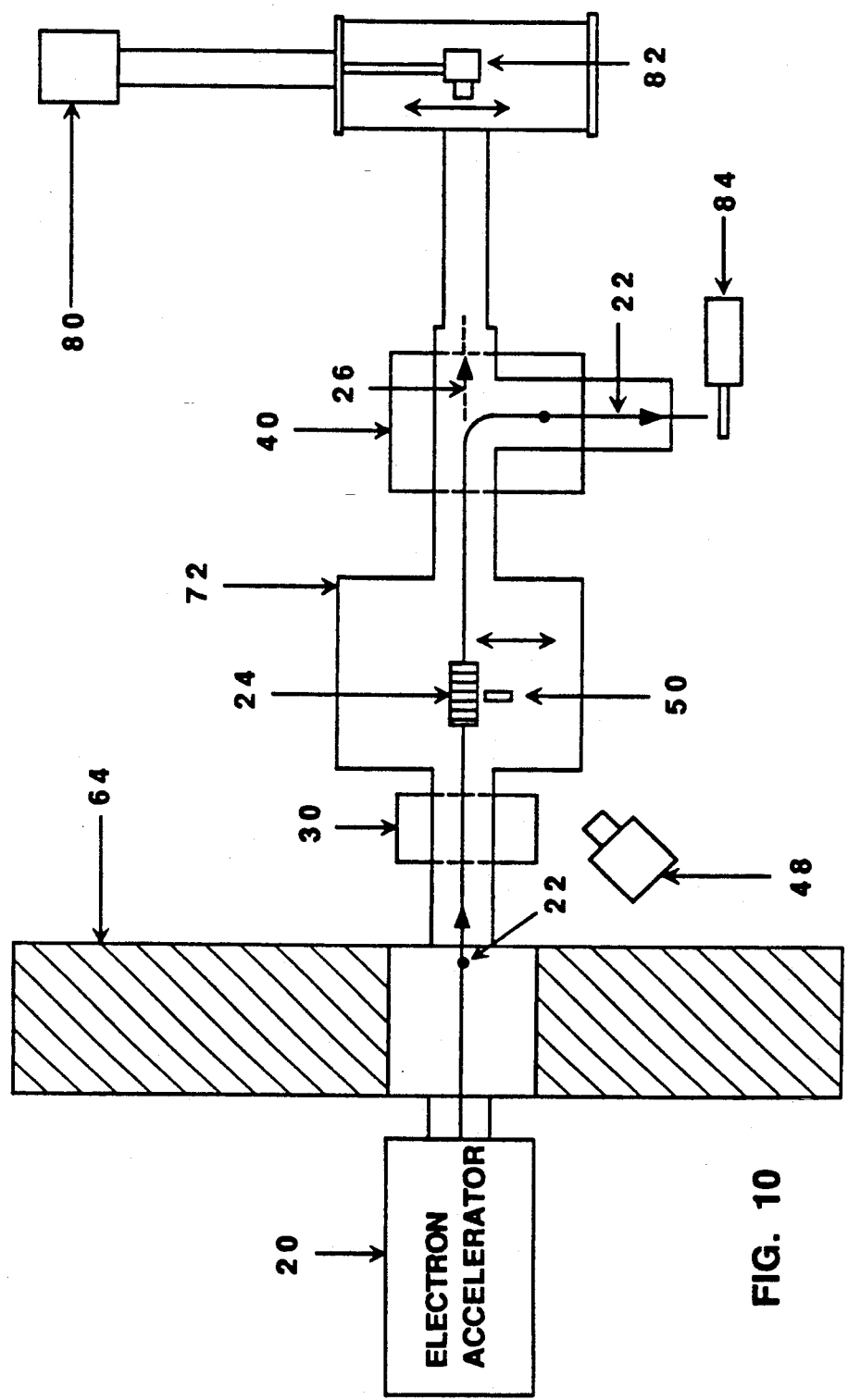
FIG. 10 shows the NPS experimental system for producing a uniform X-ray flux and measuring its profile.

This results in the radiation cone or annulus being smeared out and the center of the annulus being filled. This method has been achieved in the following embodiment shown in FIG. 10.

The embodiment includes an accelerator 20, which emits a well collimated electron beam 22 which passes through a magnetic cylindrical lens 30 and then through the foil stack 24 where X-ray transition radiation was generated. The X rays 26 continue on to a linear diode array detector 82 where the X-ray beam profile was measured. The accelerator was the Naval Postgraduate School 100 MeV linac in Monterey Calif. The distance between the foil stack 24 and the linear diode array detector 82 was 1.3 meters. The electron-beam diameter and divergence was adjusted by the magnetic cylindrical lens 30 so that the central hole of the emitted X-ray radiation annulus is filled, where it illuminates the target area on the mask and wafer. This results in the X-ray radiation pattern being uniform.

Figure 11:
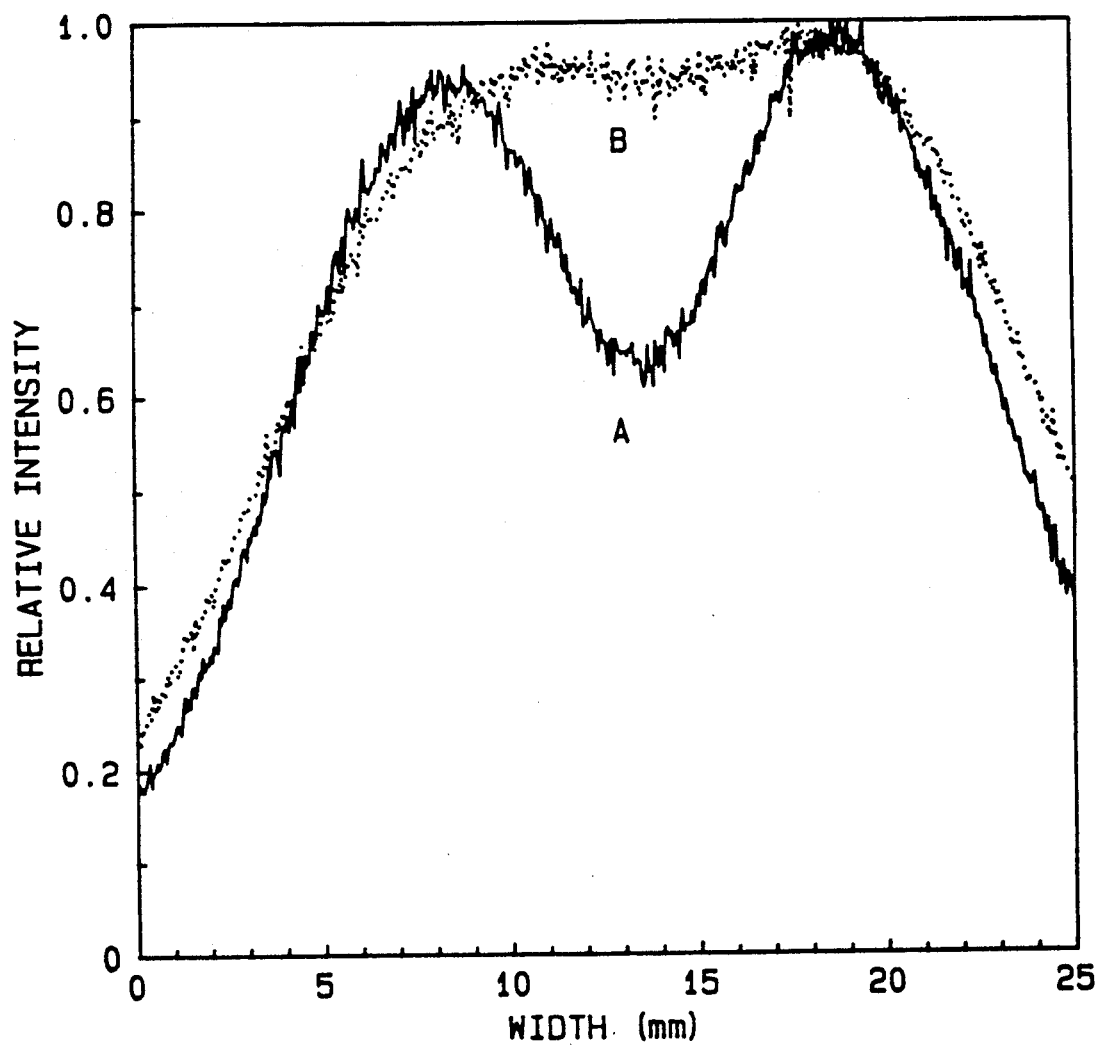
FIG. 11 shows the measured profiles of the X-ray flux (a) without magnetic optics and (b) with magnetic optics.

Uniformity was achieved by observing the radiation pattern with the linear diode array 82. By changing the current in the magnetic cylindrical lens 30, the focal length of the lens changes and, hence, the electron-beam divergence and spot size changes at the transition radiator 24. This in turn affects the radiation pattern emitted from the radiator. Adjustment of the lens 30 thus changes the observed X-ray pattern at the detector 82. FIG. 11 shows the profiles of the radiation pattern before and after focusing. In curve (a) the characteristic X-ray annulus was obtained. Adjusting the focus of the electron beam so that the center of the annulus disappears and the radiation profile flattens in curve (b). The variation is less than ±5%.

With the embodiment given in FIG. 4 and the experiments at SAL and NPS, we have solved the major problems of uniformity, cooling and power density (spot size and total power). Thus we have proved that these embodiments are excellent X-ray lithography sources.

The simple embodiment shown in FIG. 9 differs from the prior art in that it has a means of uniformity (the magnetic cylindrical lens 30), an optimized beam energy, optimized radiator (the beryllium stack of 25 foils 1 µm thick), and optimum radiator-to-source distance (approximately 3 meters) which gives room for adequate shielding and the desired beam spot size of 6 to 12 cm$^2$. This new embodiment has achieved 15.2 mW of power and uniformity of ±5%. This is 22 times the power achieved by previous transition radiators and 7 times the power achieved by laser-plasma sources.

Figure 12:
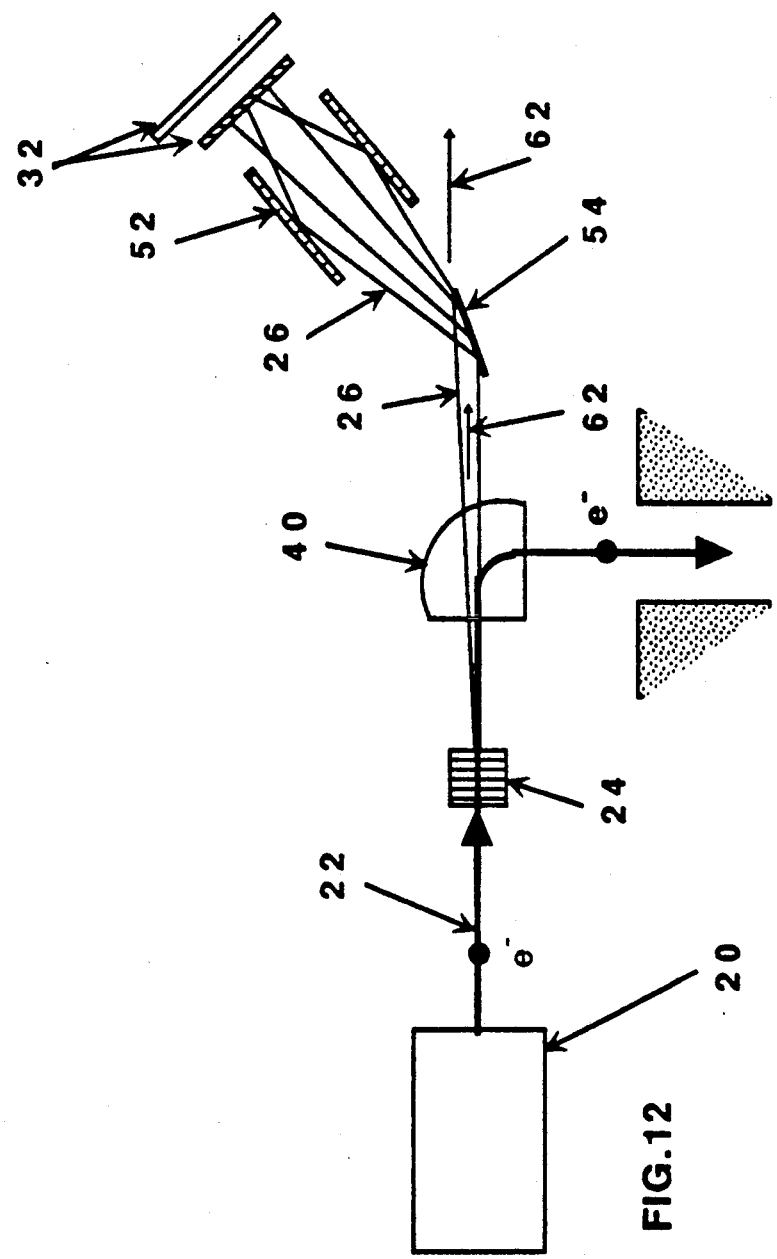
FIG. 12 shows a one station system with a grazing angle mirror which is wobbled to provide a uniform flux at the mask and wafer.

Another embodiment for achieving uniform X-ray exposure over 6 cm$^2$ to 12 cm$^2$ is shown in FIG. 12. The X-ray beam 26 is scanned by tilting or wobbling a grazing-angle reflector 54. The apparatus consists of an electron accelerator 20 which emits a well collimated beam 22 which is directed through a transition radiator 24 which produces soft X-rays 26 from transition radiator 24 which produces soft X-rays 26 from transition radiation. The electrons are bent out of the way by a beam dump magnet 40. The X-rays 26 continue on to a grazing angle reflector 54 which directs the X-rays 26 to the mask and wafer 32. The grazing angle mirror is mechanically wobbled or tilted moving the X-rays 26. This causes the time-average power of the X-rays 26 across the mask and wafer 32 to be uniform. The divergence of the X-ray beam is also increased increasing the overlay error (increased shadowing of the circuit image of the mask on the resist). However, if the angle of wobble is on the order of $2/\gamma$ then the total divergence is $2\sqrt{2}/\gamma$ which for most cases considered here is permitable.

The grazing angle mirror 54 also serves the purpose of separating the neutrons 62 and any other gamma radiation that might have been generated by the foils 24 or in the accelerator 20 from striking the mask and wafer 32 or harming operators of the apparatus. The grazing angle mirror 54 will reflect only the soft X-rays and not the neutrons or harder (more energetic) X-rays. In some cases the neutrons and the harder X-rays will penetrate the mask and expose the entire wafer.

The grazing-angle reflector is composed of either a flat or slightly curved X-ray mirror whose dimensions are determined by the grazing angle, $\phi$, by the distance from the radiator to grazing-angle reflector, $L_g$, and by the angular divergence of the conical X-ray annulus ($\theta \simeq \pm 3/\gamma$). The minimum length, $l_{min}$, of optic is then given by:

$$l_{min} \simeq \frac{6L_g}{\gamma\phi} \tag{8}$$

and the minimum width, $w_{min}$, of the mirror is given by:

$$w_{min} \simeq \frac{6L_g}{\gamma} \tag{9}$$

As an example, assuming that the distance from the radiator to grazing-angle reflector is $L_g=20$ cm, the electron beam energy is 150 MeV ($\gamma \pm 300$), and the grazing angle $\phi=10$ mR, then $l_{min}=6.6$ cm and $w_{min}=0.4$ cm.

In another embodiment again using FIG. 12, the X-ray beam 26 is scanned by moving the mask and wafer 32. The mask and wafer is moved rapidly causing the time-average power of the X-rays across the mask and wafer to be uniform. In this case the divergence of the X-rays is not increased. The grazing angle mirror 54 is held fixed. The mask and wafer 32 is mechanically scanned. The X-ray beam is made as small as possible either by using collecting optics or by moving the mask and wafer close to the radiator 24. This method is an excellent one since many steppers (mechanical devices for moving the mask and wafer) are already designed to do this for synchrotron sources. These mask and wafer steppers have this capability of moving the mask and wafer quickly.

In another embodiment the X-ray beam is scanned by changing the angle at which the electron beam strikes the transition radiator. The beam spot is not moved in order to maintain minimum spot size. This again causes the time average power of the X-rays across the mask and wafer to be uniform. In these two cases where either the X-ray beam or electron beam is scanned, the power-per-unit area is decreased from the case where the cylindrical optic is used and the divergence of the X-ray beam is increased resulting in increased overlay error.

3. Parameter Selection

3.1 Foil Material Thickness, and Number Selection

In the present invention, the radiation spectrum can be optimized for the desired photon energies and total output power by proper selection of the foil thickness and material. Making the foils thinner than what described in the prior art and increasing their number increases the flux of the lowest energy X rays (left side of the energy spectrum). This is because the thinner foils are now less absorbing and the formation length is best for the lowest-energy X-ray production. The efficiency of the radiation per foil is less than optimum for the center and harder X-rays in the spectrum.

This is done by making the foil thickness less than its optimum value for the center frequency of the spectrum $\omega_0$ (or effectively optimizing the foil thickness at the softer X-ray frequencies $\omega_s$, $\omega_s < \omega_0$):

$$l_2 = 1.34 Z_2(\omega_s) < 1.34 Z_2(\omega_0), \tag{10}$$

and increasing the number of foils above:

$$M \geq \frac{2}{\mu_2(\omega_s) l_2(\omega_s)} \tag{11}$$

Figure 3:
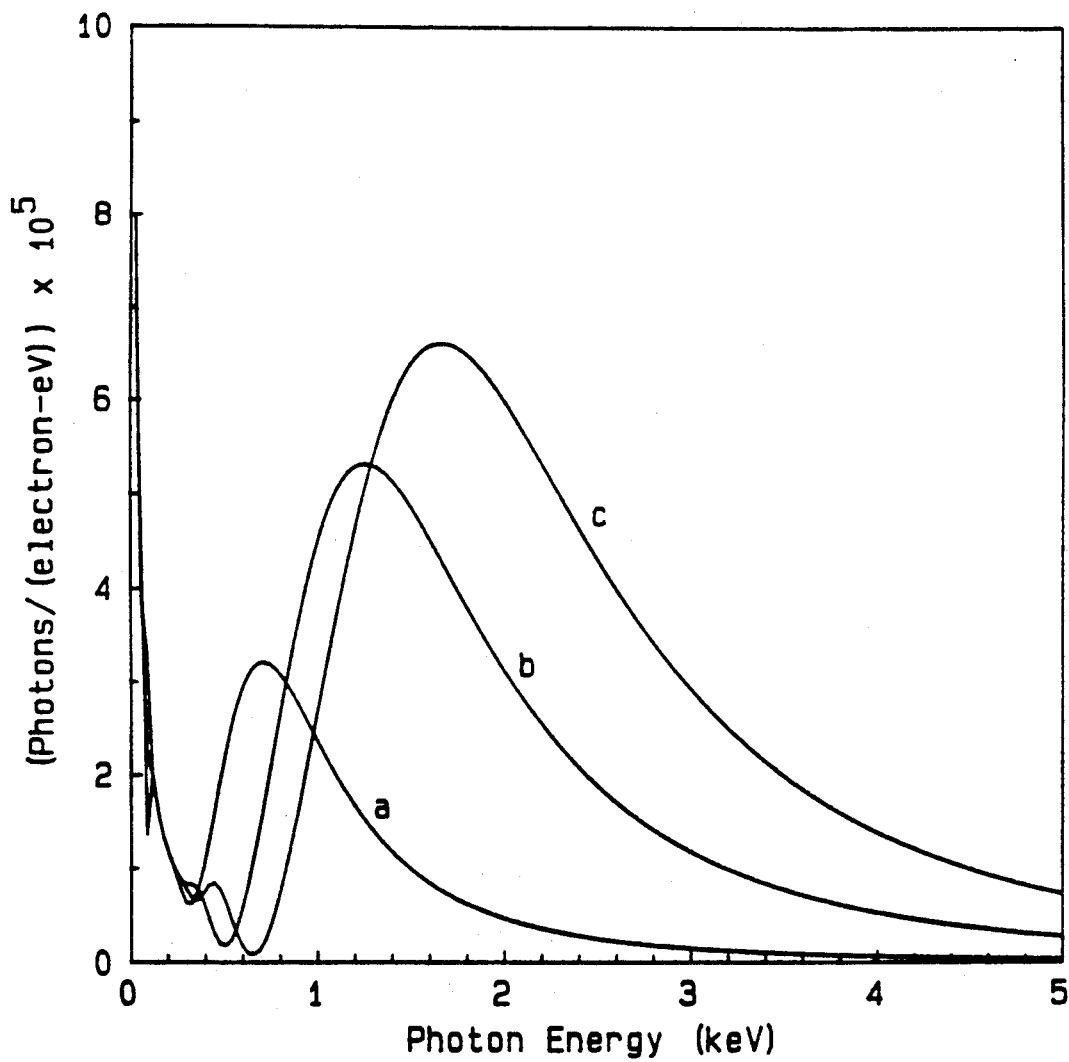
FIG. 3 (Prior Art) shows the theoretical spectra from three foil stacks composed of beryllium and optimized at 700, 1200, and 1800 eV, respectively: (a) $l_2=1$ μm, M=6, (b) $l_2=1.76$ μm, M=19, (c) $l_2=2.3$ μm, M=35.
Figure 13:
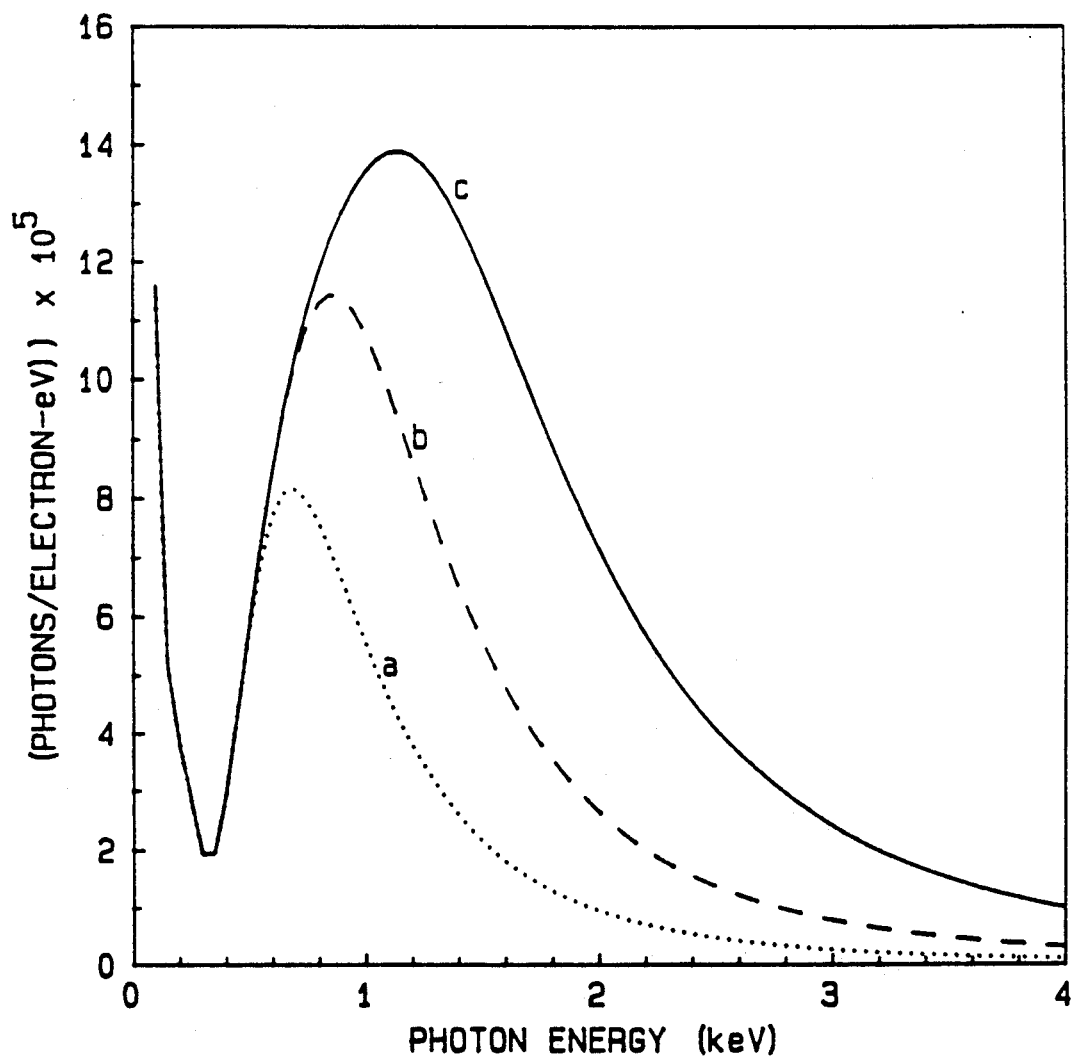
FIG. 13 shows the theoretical spectra from three stacks composed of 1-μm beryllium foils and designed to have the majority of their photon energies below 2 keV (a) M=5, (b) M=15, and (c) M=35 these are compared to the stack of FIG. 3, curve (c) of the prior art.

This is demonstrated in FIG. 13 where the flux was first optimized at $\omega_0 = 700$ eV, making $l_2 1$ μm and M = 5 foils for 150 MeV electron-beam energy. Increasing the number of foils now increases the peak radiation, photons/electron-eV), shifts the right side of the spectrum to the right increasing the hard X rays), but does not decrease the desirable, soft X rays. Comparing to FIG. 3, we see what has been gained. Curve FIG. 3(c) of the prior art, has been shifted to the right in the spectrum, while curve FIG. 13(c) stays to the left giving softer X rays. Maximum value for 1-μm foils is approximately 50 foils with the spectrum given by curve (c).

It is extremely important for optimizing the spectrum to match the mask substrate and absorber material's transmission and absorption characteristics. The X rays must penetrate the mask and yet be stopped by the absorber material. Based on resist sensitivity, absorber material, and printability of defects, the preferred wavelength range for X-ray lithography using single levels of conventional resist materials is 7–10 Angstroms (1771–1240 eV). Higher photon energies will penetrate the mask absorber and decrease the contrast in the circuit image. Thus going over 2 keV will decrease the contrast in the circuit image.

In one embodiment we used beryllium foils for maximum photon production. To optimize the frequency spectrum we follow the above optimization procedure as demonstrated in FIG. 13. The spectrum is optimized to keep the half-power point on the spectrum below 2 keV as shown in FIG. 13, curves (a)–(c). Thus for the 150 MeV case shown, the foil thickness $l_2 = 1$ μm and M = 50 foils. This embodiment will give the bright, optimum-spectrum source for lithography.

The selection of the foil material can also dramatically effect the spectrum shape especially if the foil material has a K or L shell photoabsorption edge in the frequency region of maximum X-ray production. Above the K-shell photoabsorption edge photon energy, the spectrum is dramatically attenuated by the absorption of the X-rays in the foils.

Figure 1:
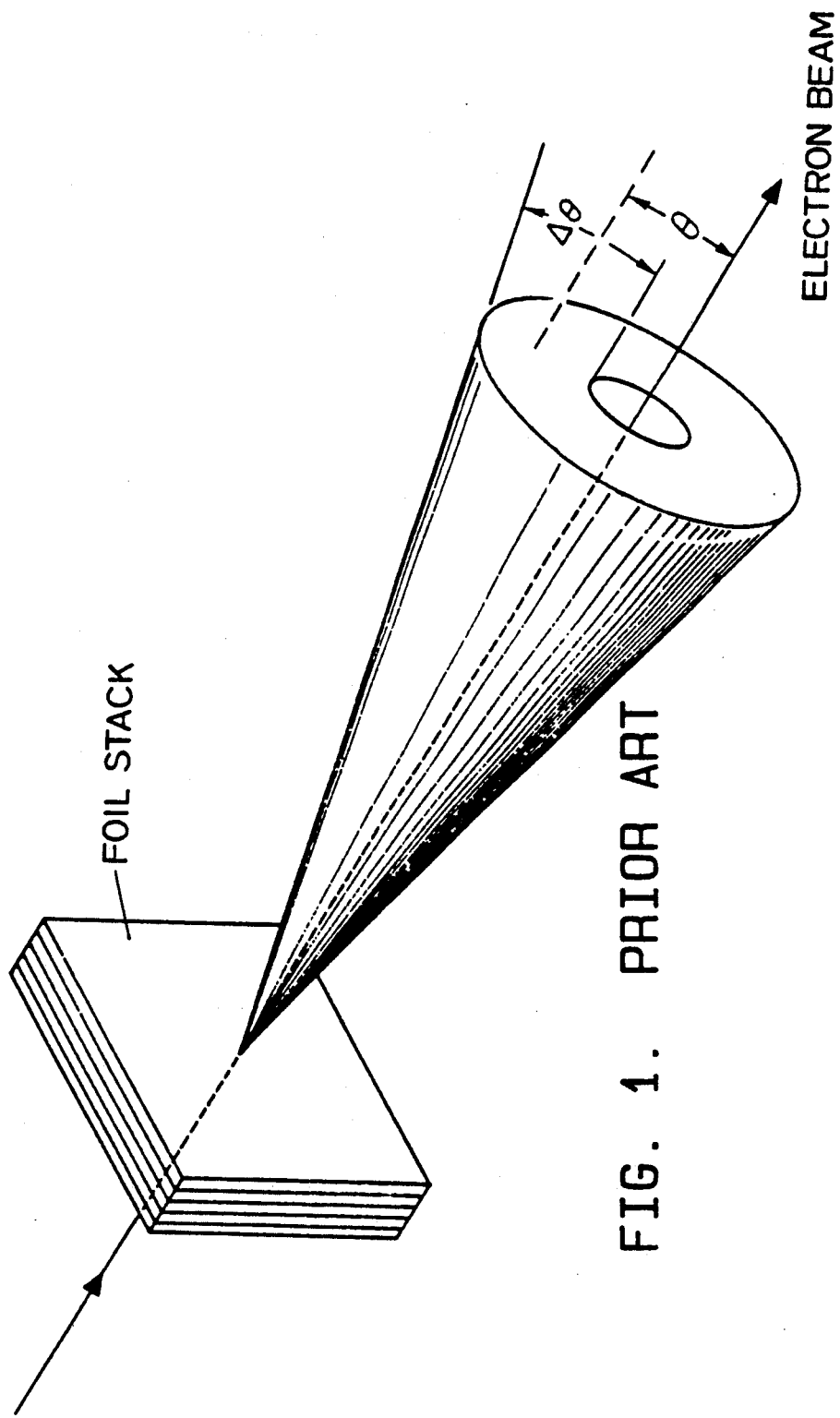
FIG. 1 (Prior art) shows X rays being generated in a conical radiation pattern by charged particles striking thin foils.
Figure 2:
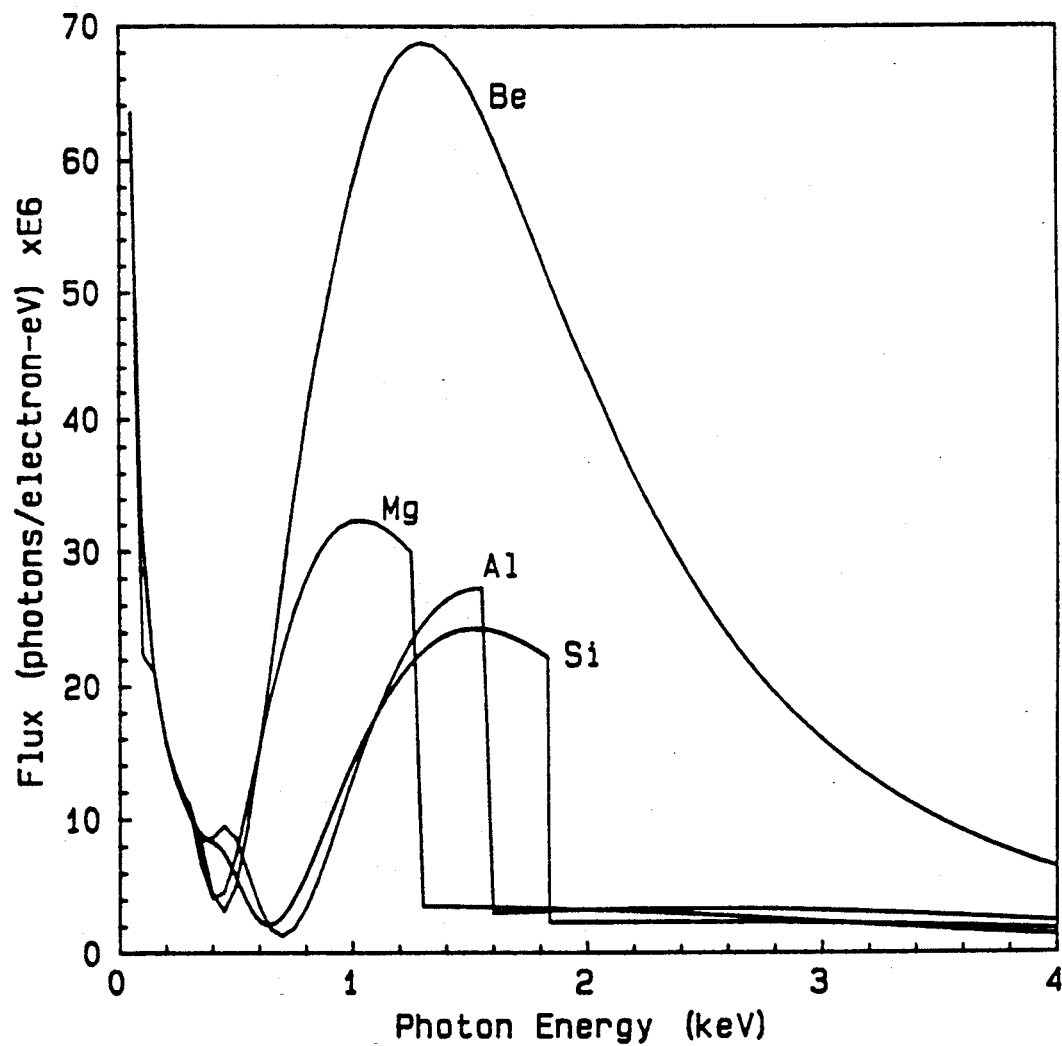
FIG. 2 (Prior art) shows the theoretical spectra from different foil stacks composed of Be, Al, Si and Mg with an electron-beam energy of 100 MeV: absorption in the foils limits the number of foils to 35 for Be, and 12 each for Si, Mg, and Al; foil thickness is 1.5 $\mu$m for all materials.

Thus in one embodiment one can select the foil material for the radiator to be the same as that of the mask substrate material. This works well with silicon as the mask substrate and the radiator foil material. As can be seen from FIG. 2, the silicon radiator spectrum cuts off above 1800 ev. Since a mask substrate absorbs above 1800 eV, the silicon foil radiator spectrum is ideal for obtaining maximum contrast.

3.2 Electron-beam Energy Selection

In one embodiment of the present invention, the electron-beam energy, E, and radiator-to-mask distance is selected to achieve maximum X-ray beam area of 6 to 12 cm$^2$ at the mask target area. If no optics are used, the radius of the conical X-ray annulus is given approximately by:

$$r \approx \frac{2Z_0}{\gamma} = \frac{2Z_0 E_0}{E}, \tag{12}$$

where $Z_0$ is the distance from the transition radiator to the mask and wafer. A $Z_0 = 3$ meter radiator-to-mask distance, and an electron-beam energy of 150 MeV would give a 12 cm$^2$ X-ray beam spot.

Below 100 MeV, the diameter of the conical X-ray annulus becomes excessively large, requiring collecting optics to collect and collimate or focus the X-rays to an area of 6 cm$^2$ to 12 cm$^2$ at a distance from the foil stack to mask/wafer target of more than 1 meter. A $Z_0 = 3$ meter radiator-to-mask distance and an electron-beam energy of 50 MeV would give a 113 cm$^2$ conical X-ray beam area—too large for currently mask technology. Collection optics described in this patent can reduce this to the require 6 cm$^2$ to 12 cm$^2$.

The minimum electron-beam energy, E, is also prescribed by geometrical errors due to penumbral blurring and overlay error. The source divergence limits the overlay of various circuit image features. Since the divergence of the conical X-ray annulus is proportional to $E_0/E$, the higher the electron-beam energy the smaller the overlay error. Above 150 MeV the overlay error is not appreciable for 0.5 μm feature sizes. The addition of an optic can either help or exacerbate the problem. In the present invention electron-beam energies and/or optics are selected which minimize the overlay error and penumbral blurring.

3.3 Electron-beam Energy Selection to Minimize Geometrical Errors

Without collection optics, the minimum electron-beam energy, E, is also prescribed by geometrical errors due to penumbral blurring and overlay error. There is feature-edge degradation from penumbral blur due to the finite diameter of the X-ray source. In addition the source divergence limit the overlay of various circuit image features due to the lateral translation of the images whose magnitude ΔR depends upon both maximum X-ray divergence $\theta$ and the gap spacing g. These geometrical errors are shown graphically in FIG. 14. These effects were not discussed in the prior art for transition sources.

3.3a. Penumbral Blur

Penumbral blur results from the X-ray sources finite diameter D. In the case of transition radiation, the diameter of the x-ray source is the diameter of the electron beam at the transition radiator. The source can produce two rays 26 on either side of the source diameter which will cross at the edge of a circuit feature to be imaged. The two rays will continue on and cross gap, g the distance between the mask 66 and the wafer 68. The resulting image is blurred by:

$$\Delta x = Dg/Z_0 \quad (13)$$

As seen above, the minimum radiator-to-mask distance, $Z_0$, is require to result in a 4-cm diameter spot, and for shielding and adequate room for beam dump system is approximately $Z_0 = 3$ meters. Electron-beam diameters of between 0.25 and 1 mm are easily achieved from a linac. Assuming $D = 1$ mm and the desired gap spacing is 25 µm (a value used by the X-ray lithography industry) then the penumbral blur for a 181 MeV beam is $\Delta x = 7.5$ nm. Since we are looking for feature sizes no smaller than 100 nm, these parameters are adequate.

3.3b. Overlay Error

A more serious confining geometrical degradation is the overlay error. This error results from the fact that the source has a finite divergence and that there is some variation in the mask-to-wafer distance, $\Delta g$. For X-rays 26 grazing a circuit feature on mask 66, this variation in the mask-to-wafer distance will cause a blurred image of $\Delta R$ on the wafer 68. As can be seen by FIG. 14 this results in a magnification error of $$\Delta R = \theta \Delta g. \quad (14)$$

In order to achieve realistic mask substrates, the desired variation in mask-to-wafer distance, $\Delta g$, is not to exceed 5 µm. This is a realizable value based on current mask technology and the required value described in the synchrotron lithography source literature. Since the desired feature sizes are less than 0.5 µm, a maximum overlay error of 0.1 µm or 100 nm is required. This limits the divergence of the X-ray source to be $\theta = 0.1/5 = 10$ mR. In order to achieve this divergence and still obtain an appreciable part of the X-ray flux one must have divergence of $\theta = 3/\gamma$ or larger. Assuming $\theta = 3/\gamma$, then the electron energy must be $E = 3(0.511/10^{-2}) \approx 150$ MeV. Note: if the variation in mask-to-wafer gap can be reduced to 0.5 µm as is being attempted by laser-plasma technology, then the required beam energy can be dropped to a considerably lower value that depends only on the desired source brightness.

Optics can increase the overlay error and penumbral blur. For example, if the cylindrical optic has more than one reflection of the X-rays, the image will blur due to crossing rays at the mask and wafer target. Elliptical optics will increase the angular spread of the X-rays at the mask and wafer target and thus will increase overlay error. Thus caution must be exercised when these two methods are used such that the total error or pattern distortion does not exceed 33% of the desired pattern definition. For example, if 0.5 µm pattern definition is desired, the maximum permissible error is 165 nm.

Rather than having the electron beam energy determine the effects of penumbral blur and magnification error, one can alternatively bound the electron-beam diameter, D, and divergence, $\theta_d$, at the foil stack. Using equation (13)

$$D \leq \frac{\Delta x Z_0}{g} \quad (15)$$

Assuming that the total divergence of the photon beam is given by the quadrature sum of the electron divergence and photon divergence, $1/\gamma$, then:

$$\theta_d \leq \left( \left( \frac{\Delta R}{\Delta g} \right)^2 - \left( \frac{E_0}{E} \right)^2 \right)^{\frac{1}{2}} \quad (16)$$

where the quadrature sum of the errors $\Delta x$ and $\Delta R$ must be less than about 30% of the minimum feature size, x:

$$(\Delta x^2 + \Delta R^2)^{\frac{1}{2}} \leq 0.3 x \quad (17)$$

In summary: from X-ray beam spot size considerations, desired maximum overlay error values, required X-ray power, and efficient use of the total X-ray cone, the simplest preferred embodiment requires an electron-beam energy of approximately 100 to 250 MeV. This embodiment requires no optics. A lower electron-beam energy can be used if such collection optics are used. Thus two single-station embodiments are considered here: one with moderate energy electron-beam (100 to 250 MeV), and another with low energy electron beam (25 to 100 MeV). The moderate energy case is the simplest requiring little or no optics to achieve a spot size at the mask/wafer of 6 to 12 $cm^2$ (with radiator to mask/wafer of 2 to 3 meters, adequate distance for radiation shielding). The low energy case may require collection optics to concentrate the X-rays to a 6 to 12 $cm^2$ spot, but is less expensive because of the smaller linac. This again allows a radiator to mask/wafer distance of 2 to 3 meters.

4. Grazing-Angle Optics of X-ray Collection, Translation and Uniformity

4.1 The Need for Collecting the Entire Conical X-ray Annulus

Much of the X-ray power is at larger cone angles than $\theta = 1/\gamma$; thus X-rays outside the $1/\gamma$ cone will not be used with an uncollimated X-ray beam because the power density is lower outside the $1/\gamma$ cone. Although the power density drops dramatically after $2/\gamma$, there is radiation emitted out to:

$$\theta_{max} = (1/\gamma^2 + (\omega_2/\omega)^2)^{\frac{1}{2}} \quad (18)$$

For large, $\gamma$, then $\theta \approx \omega_2/\omega$. For beryllium foils $\omega_2 = 26.1$ eV, for $\omega = 1500$ eV, $\theta = 18$ mR. To achieve efficient use of the X-rays we need to collect out to this angle.

Figure 15:
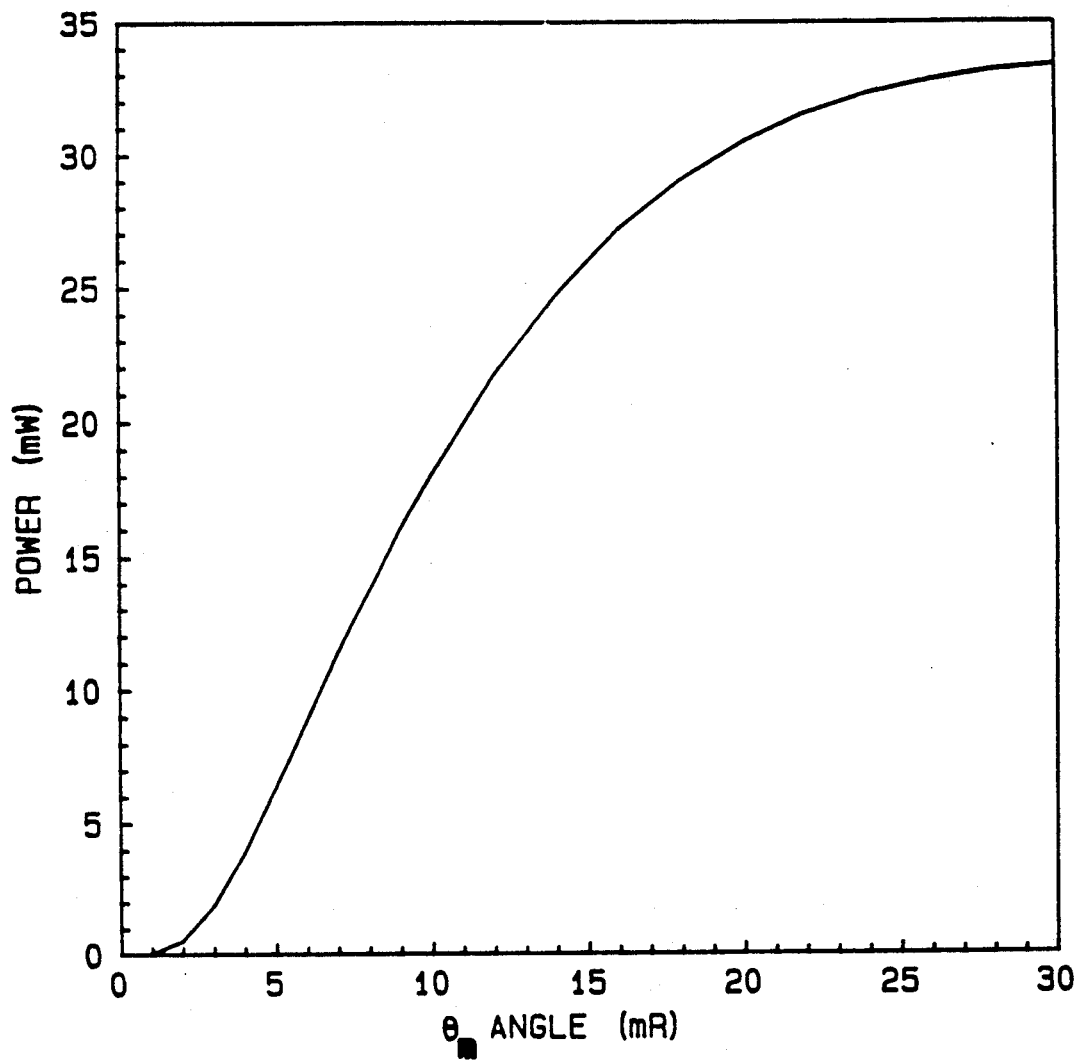
FIG. 15 shows the integrated power from 0 to $\theta_m$ as a function of $\theta_m$ for a 150 MeV electron beam.

The total power $P_t$ available out to a particular angle $\theta_m$ is given by the integral of the power density over the area of the annulus from $\theta = 0$ to $\theta = \theta_m$:

$$P_t = 2\pi \int \left( \frac{dP}{dA} \right) Z_0 \, d\theta \quad (19)$$

where $Z_0$ is the distance form the radiator to the mask and wafer. This integral was performed as a function of $\theta_m$ and the results are plotted for two cases in FIGS. 15 and 16. FIG. 15 is for the core of 42 foils of 1-µm beryllium with an electron-beam energy of 150 MeV and a current of 100 μA. The 1/γ angle of peak power density is 3.4 mR for the 150 MeV electron beam. As we can see from FIG. 15, one needs to go out to 18 mR or 5/γ to get 90% of the total power available.

Figure 16:
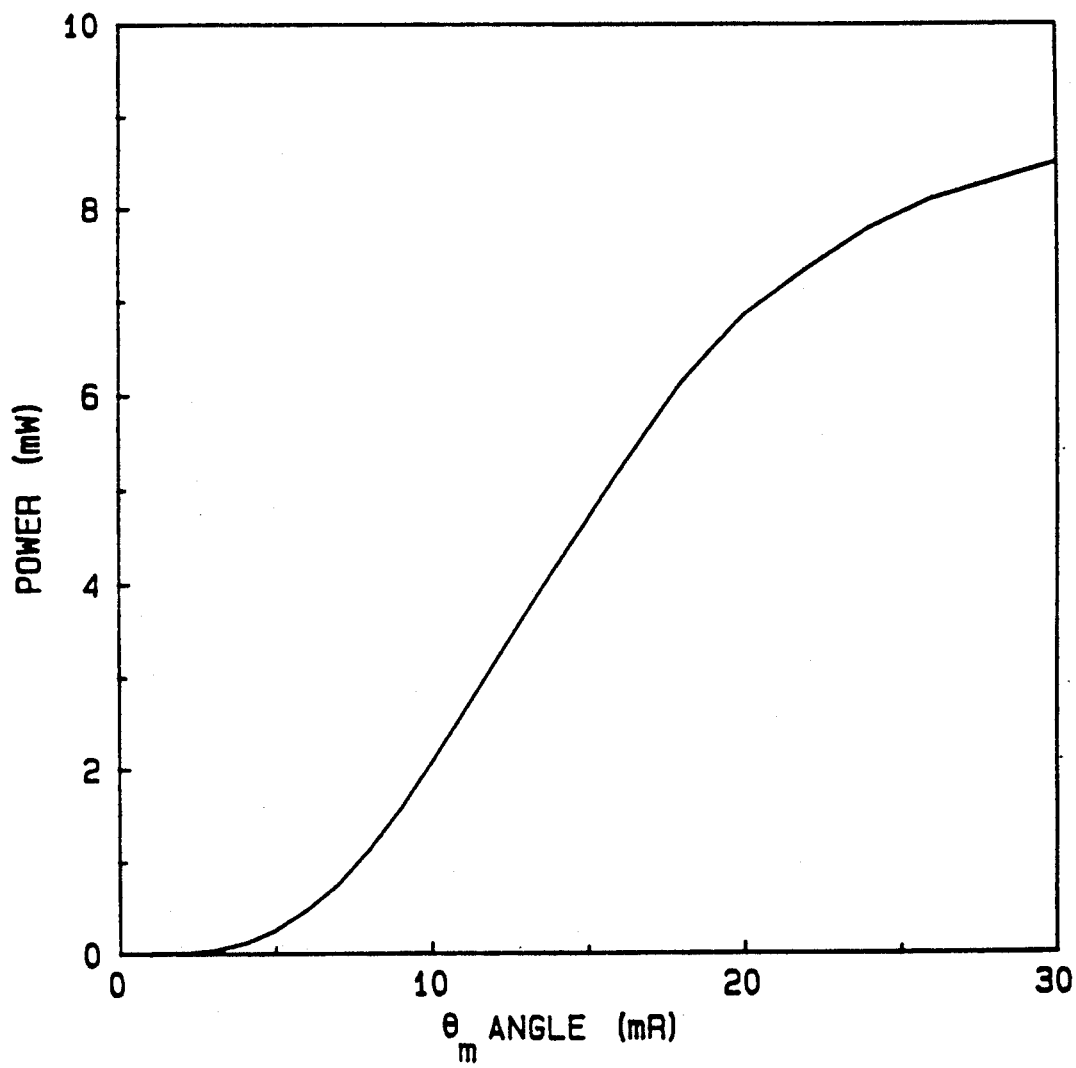
FIG. 16 shows the integrated power from 0 to $\theta_m$ as a function of $\theta_m$ for a 50 MeV electron beam.

For lower electron-beam energies, one needs not go out to such large factors of 1/γ in order to collect the maximum amount of radiation. This is shown in FIG. 16, where the same beryllium foil stack is used with the electron-beam energy of 50 MeV, and current of 100 μA. The 1/65 peak is at 10 mR and the 90% point is approximately at $\theta = 24$ mR or 2.4/γ. Thus optics for this electron-beam energy need only collect from 1/2γ to 2.4/γ or between 5 mR to 24 mR. This is about the same for the 150 MeV case where we need to collect between 1.5 to 18 mR.

4.2 Grazing Incident Optics

Since the cone of emission is already highly directional and coaxial with the direction of the electron beam, the grazing-angle X-ray cylindrical optics can be used for three functions: collection, translation and uniformity. At X-ray wavelengths, materials have an index of refraction that is less than unity, thereby allowing total reflection at a vacuum-material interface. The complex index of refraction, n, for a medium at X-ray wavelengths may be written as $$n = 1 - \delta - i\beta \quad (20)$$

where $\delta$ and $\beta$ are positive. If $\beta$ is negligible, total reflection from vacuum-to-medium occurs if the angle of incidence $\theta$ is less than the critical angle $\theta_c$, where:

$$\theta_c = \sqrt{2\delta} \simeq \frac{\omega_p}{\omega}, \quad (21)$$

and $\omega_p$ is the plasma frequency of the optics medium and $\omega$ is the frequency of the radiation. For the purposes of this description, the grazing angle is defined as the angle between the reflecting optics surface and the incoming X-ray beam whose angular value is sufficiently small that reflection of the X-ray beam occurs at said surface and is not absorbed. For the case where the optic element is composed entirely of a solid such as quartz, the maximum angle is given by $\theta_c$. Thus in this case the grazing angle would be angle an $\theta$, which is less than $\theta_c$.

4.3 Cylindrical Optics

Figure 17:
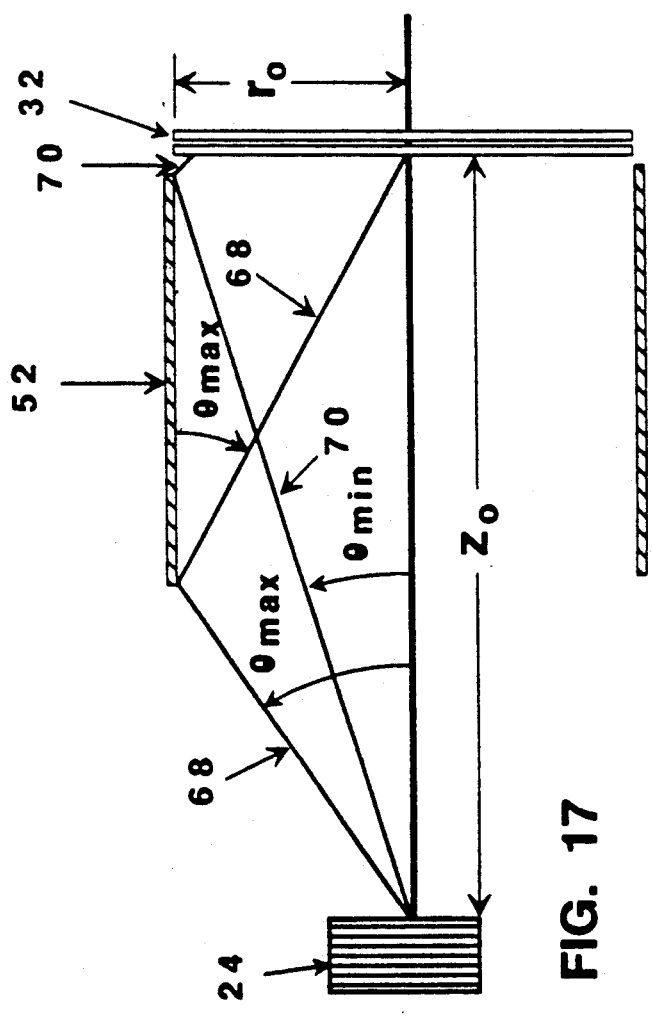
FIG. 17 shows an embodiment for X-ray lithography using a cylindrical optic for the collection and transport of the X-rays to the mask and wafer.

With a quartz tube with $\omega_p = 33.2$ eV the critical angle is $\theta_c = 16.6$ mr for 2 keV X rays. X rays hitting the surface with angles at or less than the critical angle will be reflected at nearly 100% efficiency. By placing a quartz tube along the cone's axis the X rays can be collected. This is illustrated by the ray-tracing diagram shown in FIG. 17. The radiation cone is intercepted by the quartz tube and collected on a mask and wafer target at a distance away from the radiator. In its simplest embodiment, the cylinder of glass or quartz can act as the collector for the X-ray annulus mode produced by a transition radiator, gathering and partially focusing the X-rays at a larger distance from the radiator. In FIG. 17 it consists of a radiator 24 which generates X rays 68 and 70 in the characteristic annulus which is then reflected by the cylindrical optic 52 to the mask and silicon wafer 32. They are placed forward of the focus (upstream) so that an appreciable area (e.g. 6 to 12 cm²) is illuminated by all the rays.

Having more than one bounce will give crossed rays at the mask and wafer which will lead to significant blurring. Thus we will confine our optic to having only one bounce of the cylinder wall. This limits the range of angles that the optic will accept and, hence, limits the total amount of X-ray power that can be reflected and collected. Assuming we wish to expose an area of radius $r_0$ of tube optic is brought up to the mask and wafer. The two rays of maximum and minimum angles that can just be reflected cross at the mask and wafer are shown as rays 68 and 70. The distance from the radiator to the mask and wafer is $Z_0$, the radius of the tube is $r_0$ which is also equal to the radius of the desired spot size. From simple geometrical considerations the angles $\theta_{max}$ and $\theta_{min}$ are given by:

$$\text{Tan}\theta_{max} = r_0/Z_0 \quad (22)$$

$$\text{Tan}\theta_{min} = 2r_0/Z_0 \quad (23)$$

thus:

$$\text{Tan}\theta_{min} = 2\text{Tan}\theta_{max} \quad (24)$$

Since the total power radiated goes effectively as the quadrature of the annulus radius, the outside of the annulus contains most of the power. Using the mode without reflection gives the annulus with intensity peaks $\theta \leq 1/\gamma$; however, more than half of the power lies outside $\theta = 1/\gamma$. At 50 MeV, in the unreflected or "primary mode" most of the power density of the mode is between 1/2γ and 2.4/γ. Thus a great deal of the radiation is lost if the X-rays outside the $\gamma = 1/\gamma$ cone are not utilized. The cylindrical optic can effectively utilize this radiation outside the $\theta = 1/\gamma$ cone by collecting it and transporting it to the mask and wafer. The optic also inverts the mode by bringing the maximum power into the center of the new reflected annulus. The mode is converted into a Gaussian-shaped mode after the reflection by placing the mask and wafer at the focus of the inside rays 68.

In order to collect more of the radiation curved surfaces of revolution can be used. Paraboloid, ellipsoidal and computer design surface-of-revolution optics can be used to collect an distribute the X-rays on to a specified area of the mask/wafer target. These three embodiments are described below.

4.4 Ellipsoidal Optics

Figure 18:
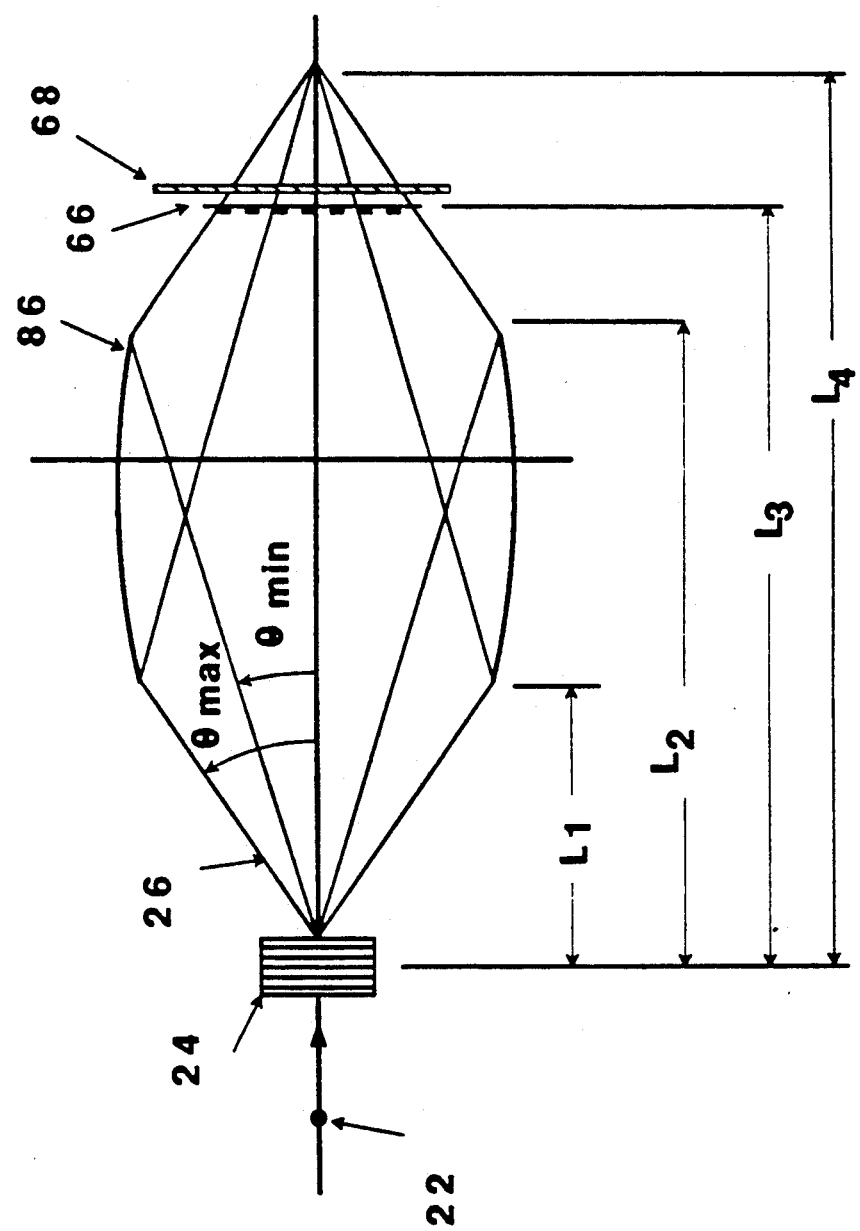
FIG. 18 shows an elliptical optic for the collection of the X-rays and redistribution on to the mask/wafer target.

How an elliptical surface of revolution can reflect and focus the entire transition radiation cone can be seen from noting the general property of a two dimensional ellipse shown in FIG. 18. This simple embodiment includes the ellipsoidal optic 86, electron beam 22, foil stack 24, and the mask/wafer combination 32. A ray emitted at one focus of an ellipse will be reflected and travel through the other focus. This is a well-known mathematical property of an ellipse. As in the straight cylinder case, reflection will occur for X-rays only if the angle of incidence is less than the critical angle, $\theta_c$, as given by (17). In order to reflect the entire radiation cone, one need only to make a surface of revolution around the major axis of the ellipse.

Given the parameters of the transition radiation cone, one can calculate the dimensions of the desired ellipse from the polar equation of the ellipse:

$$r = \frac{a(1-e^2)}{1+e\cos\phi} \quad (25)$$

where a is the radius of the major axis, e is eccentricity of the ellipse, $x = -r\cos\phi$, and $y = r\sin\phi$.

The eccentricity of the ellipse can be calculated by obtaining the slope of the tangent to the ellipse, dy/dx, and is given by $$e = -\tan(\theta+\phi)\sin\phi - \cos\phi. \quad (26)$$

The maximum transition radiation cone angle is approximately $$\theta \approx \frac{3}{2\gamma}$$

and the minimum angle is $$\theta = \frac{1}{2\gamma}.$$

Substituting these limits in eqn. 17, one finds $$e = -\tan\left(\theta_c - \frac{1}{2\gamma}\right)\sin\left(\frac{1}{2\gamma}\right) + \cos\left(\frac{1}{2\gamma}\right) \quad (27)$$

If E = 50 MeV, $1/2\gamma = 5$ mr, and the elliptical optical element is made of quartz with a plasma frequency $\omega_p = 33.2$ eV, and the X-ray photons have an energy of 2 keV, then $\theta_c = 16.6$ mr. Using eqn. (18), one finds the eccentricity of the ellipse to be e = 0.9999294. Given a value for a of 172.5 cm, then:

$$b = a\sqrt{1-e^2} = 2.05 \text{ cm}. \quad (28)$$

One must be concerned with the overlay error which requires that the divergence of the incoming X-rays be less than $\theta = \Delta R/\Delta g$. The elliptical optic will cause the direction of the incoming rays to mask and wafer to be changed and the angle of emission will be now convergent. To tolerate an overlap error of $\Delta R < 100$ nm, the maximum angle of convergence must be less than 20 mr, if the variance in mask-to-wafer distance is less than 5 $\mu$m, then larger angles can be tolerated.

4.5 Paraboloidal Optics

Where the ellipsoid focuses the paraboloid collimates. The parabola rotated around is central axis forms the reflecting surface. As before, the conical X-ray annulus fits the surface-of-revolution optics perfectly when the point of X-ray emission on the foil stack is placed at the focus of the parabola. A fundamental property of parabolas is that all lines drawn through the focus of the parabola will reflect and emerge parallel to each other, that is, collimated.

Figure 19:
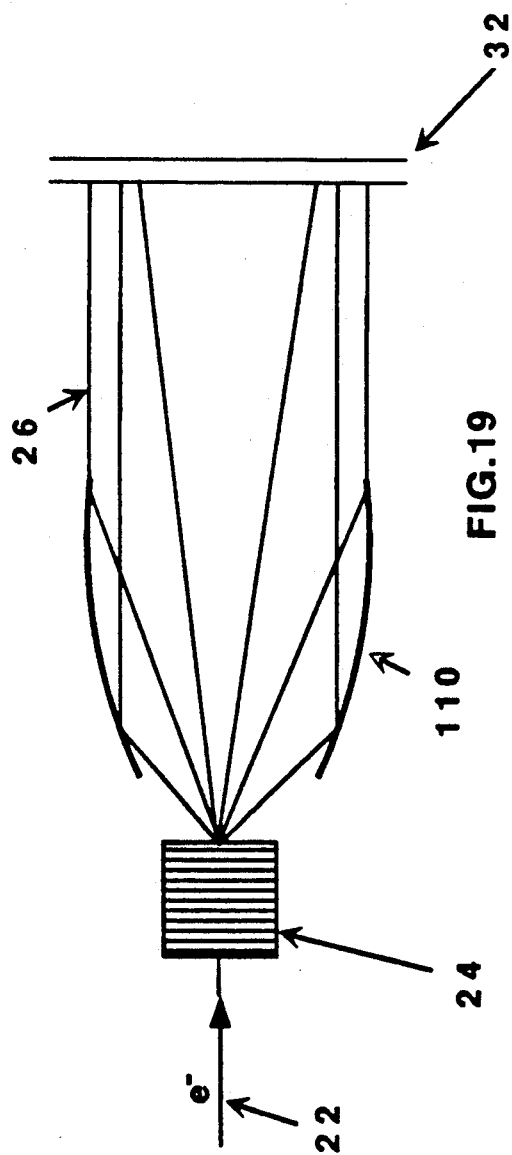
FIG. 19 shows an paraboloid optic for the collection of the X-rays and redistribution on to the mask/wafer target.

The paraboloid optic is shown in FIG. 19. The simple embodiment includes the optic 110, electron beam 22, foil stack 24, mask/wafer 32. The angular divergence of the X-rays emitted from the the paraboloid will be less that the natural divergence of the conical X-ray annulus. This means that the magnification error will be smaller and that the electron beam energy, which determines the natural angular divergence, can be smaller than the case where no paraboloid optic is used. Thus a paraboloid would be an excellent choice for an optic in the low electron-beam energy regime (25 to 100 MeV).

The general equation of a parabola, in two dimensions, may be written:

$$y^2 = 4fx \quad (29)$$

where f is the position of the focus along the x-axis. We specify a particular parabola by choosing a value for f.

In polar coordinates the equation may be written:

$$r = \frac{4f\cos\theta}{\sin^2\theta} \quad (30)$$

We wish to collimate rays which emerge from the transition radiation source over a particular range of angles; for example, from $\theta = 1/\gamma$ to $\theta = 3/\gamma$. We may specify f by choosing a distance, $X_0$, from the focus, f, to the point at which the $1/\gamma$ ray strikes the surface of the parabola. We can solve for f:

$$f = \frac{-x_0 + \sqrt{x_0^2 + \left(x_0\tan^{-1}\left(\frac{1}{\gamma}\right)\right)^2}}{2} \quad (31)$$

Given the value of f we can calculate the values of x and y for the $\theta_{min}$ and $\theta_{max}$ of our angular range. These value of x and y correspond to the dimensions of length and diameter of the parabolic optic.

4.6 Computer Aided Design of Surface-of-Revolution Lenses

There are at least two approaches for achieving uniform illumination using only surface-of-revolution optic. The first permits the core of the X-ray beam to fall on the mask up to a certain "special" angle. Radiation greater than this angle is then reflected by the lens back onto the mask in such a way that the exposure "hole" is exactly filled. It is easy to see that this special angle is just the median angle of the radiation pattern. This is true since in order to just fill the "hole", the number of photons with angles larger than this must just equal the number of photons with smaller angle.

The advantage of the above approach is that all of the photons (ignoring reflection loss) are directed to the mask. The disadvantage is that at any point on the mask, rays come from two directions (directly from the source, and from a single reflection from the lens). This results in the apparent source size being much larger than the real source size and will therefore introduce penumbral blurring.

A second approach solves this problem by introducing a baffle to block the direct ray paths. In this case, there is no "special" photon angle; all photons emitted with angles smaller than a given angle are blocked, and all photons emitted with larger angles are reflected to produce uniform illumination. The obvious disadvantage to this approach is that the effective beam intensity is reduced (by an approximate factor of 2). Assume for the remainder of this discussion that this second approach is adopted.

The software begins by permitting the user to specify the following variables:

The minimum angle in the photon distribution, $\theta_{min}$. Photon produced with smaller angles will be blocked, those with larger angles will be reflected to the mask.

The maximum angle in the photon distribution, $\theta_{max}$. Photons produced with larger angles are ignored.

The diameter of the mask to be uniformly illuminated, $d_s$.

The exit diameter of the lens to be designed, $d_e$.

In addition, the user must also provide a photon distribution (an ASCH text file of angle vs. flux). The program then computes the following, from simple geometrical considerations:

Distance from the source to the mask, L:

$$L = \frac{d_s \theta_{min}}{2} \quad (32)$$

Distance from the exit end of the less to the mask, $L_1$:

$$L_1 = L - \frac{d_e \theta_{min}}{2} \quad (33)$$

Distance from the source to the exit end of the lens, $L_2$:

$$L_2 L - L_1 \quad (34)$$

Lens radius at exit:

$$r_e = \frac{d_e}{2} \quad (35)$$

The program begins by assigning the starting coordinate pair (Z,r) to the lens cross-section, where $Z = L_2$, and $r = r_e$. The program further assigns the slope of the lens shape to an angle slightly larger than $\theta_{min}$.

$$\frac{dr}{dZ} = \theta_{min} - \Delta \quad (36)$$

where $\Delta$ is 1.2 of the bin width of the photon distribution. This means that the lowest angle photons will just grave the exit portion of the lens and continue on to the mask. Effectively, this triplet of Z,r and dr/dZ form the "seed" that, together with the angular distribution of the photons, completely determine the entire lens shape.

The program next steps through positions on the mask, starting with the largest radius and computes the number of photons necessary to fill the photon deficiency. These photons must come from the flux distribution just above $\theta_{min}$. The code depletes this distribution just the right amount and computes the mean angle of these photons. A ray from the source, with this mean angle, then intercepts the lens element having a straight line pinned at (r,Z) and fixed slope dr/dZ. This intercept defines the next locus of the lens cross-section. The angle formed from this new value of (r,Z) to the mask, together with the source angle, define the lens angle dr/dZ at this new point. The computation then iterates until the source angle is equal to or greater than $\theta_{max}$.

While the computation takes place, the cross-section of the lens is drawn on the display terminal, and a "machinist" table is written to disk, as input for a numerically controlled lathe.

After the computation is complete, the code then ray-traces each ray in the source beam for confirmation. Reflected photons are binned at the mask plane, and the distribution at the mask plane is displayed. This histogram is consistent with a uniform illumination to within the statistical accuracy of the ray-trace method ($\pm$ square root of the number of rays counted in a bin).

Figure 20:
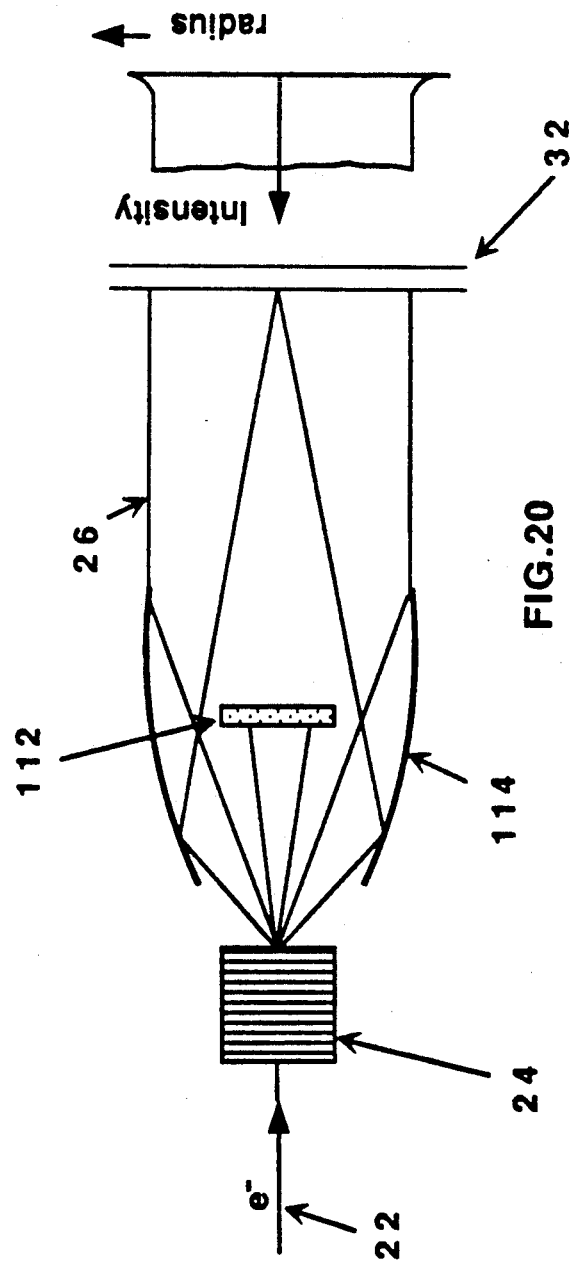
FIG. 20 shows a computer-designed optic for the collection of the X-rays and their uniform distribution over the mask/wafer target area.

The computer-optimized surface of revolution optic is shown in FIG. 20. The simple embodiment includes the surface-of revolution optic 114 with its X-ray baffle 112, electron beam 22, foil stack 24, mask 66 and wafer 68. The baffle stops any X rays that have not been reflected from reaching the mask/wafer target area. The X rays are reflected in such a way that the power is uniform across the mask/wafer target area.

4.7 Fabrication of the Surface-of-Revolution Optics

The surface-of-revolution lenses are fabricated using unique techniques developed by the authors of this patent. The method does not depended upon the shape of the longitudinal surface: ellipsoidal, paraboloid, or computer-optimized surface-of-revolution.

The method of constructing surfaces-of-revolution of arbitrary shape is as follows: a mandrel or die is first machined with the proper longitudinally curve. The surface is then polished to the required finish, and then thickly plated with a suitable material. The mandrel is etched away leaving the surface-of-revolution lens. Aluminum was chosen as the mandrel material and copper or nickel as the plating medium. The surface profile equation was developed using the mathematical theory developed in this section of the patent utilizing the parameters of the physical location of the lens, and the electron beam energy. This profile equation was converted to a control language to drive a computer-controlled lathe. The aluminum mandrel was then machined with the outside dimensions following the surface profile (such as an elliptical profile) to within $\pm 0.0005$ inches. The mandrel was polished to a less 100 angstroms rms finish by optical polishing techniques. After plating the outside diameter and the length of the lens are machined to specified dimensions for mounting in the X-ray lithography system. The aluminum can be etched away without damaging the copper or nickel surface.

5. Multiple Stack Embodiments

Figure 21:
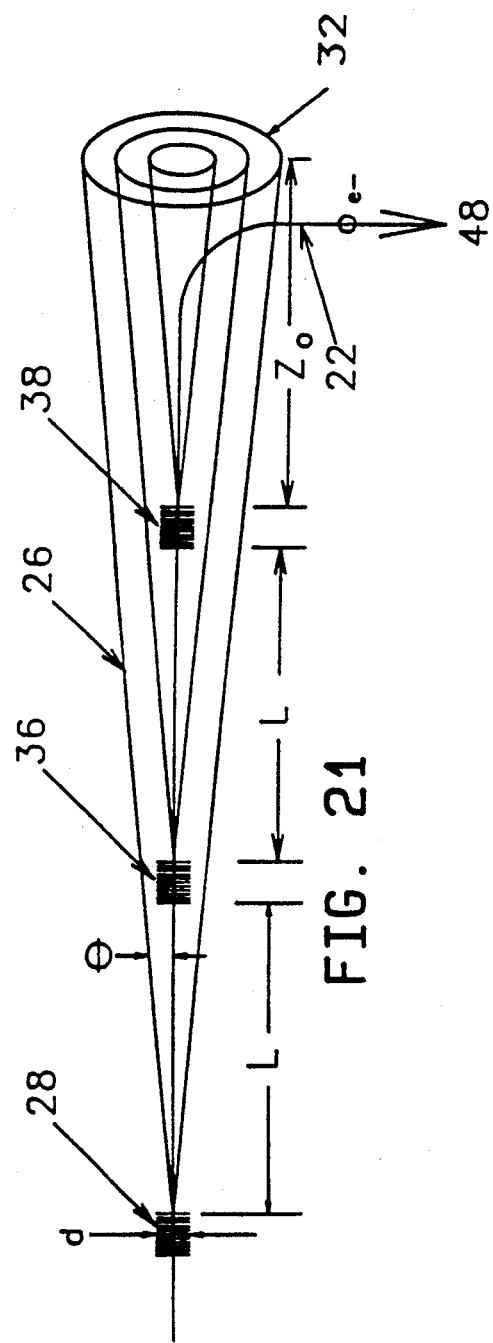
FIG. 21 shows foil stacks separated such that the naturally occurring radiation cone misses succeeding foil stacks.
Figure 22:
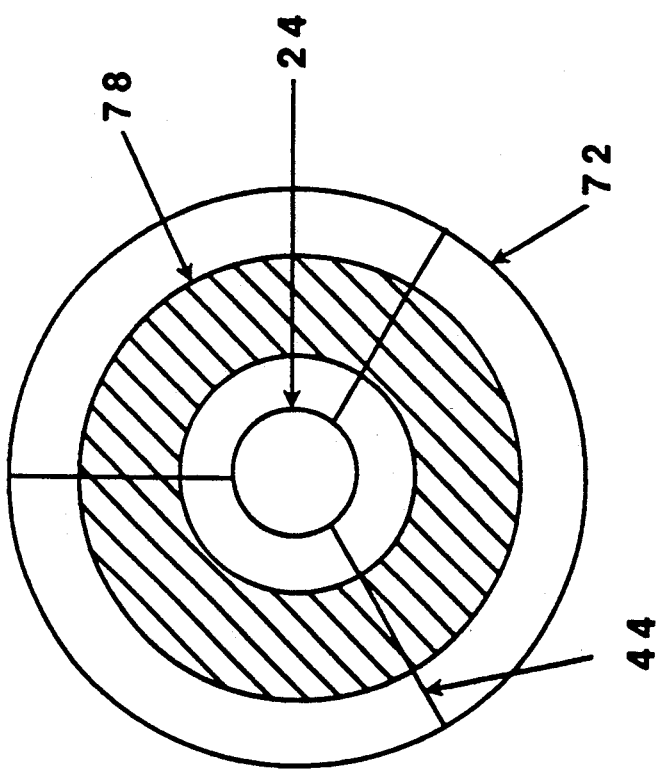
FIG. 22 shows the foils suspended by a three wire or foil spider-mount.

One way of increasing the flux is to space the foils or foil stacks such that the naturally-occurring radiation cone from the foils upstream will miss the succeeding foil stacks. As in the previous embodiments, the electron-beam diameter can be adjusted on the last stack so that the annulus 58 will be filled at the mask and wafer. As illustrated in FIG. 21, the embodiment includes a collimated electron beam 22 which strikes the first foil stack 28 which in turn emits X rays 26 in a conical annulus. X rays 26 continue on with the diameter of the annulus expanding with distance, passing around the second foil stack 36. The electron beam 22 continues along the electron-beam axis 42 striking the second foil stack 36. The second foil stack 36 is held in a spider amount which holds the foils in the electron beam 22 but permits the X rays 26 to pass around the foils with little or no obstruction. As shown in FIG. 22, the spider mount 44 includes one or more spokes which are thin in the transverse direction and can be thick in the longitudinal direction for rigidity.

Since the conical X-ray annulus is diverging at approximately $1/\gamma \simeq E_0/E$, the spacing between the foil stacks, L, and the diameter, d, of the foil stacks (and its holder) are related by the following formula:

$$d = 2\left(\frac{1}{\gamma}\right)L = 2\left(\frac{E_0}{E}\right)L, \quad (37)$$

where E is the electron beam energy $E_0$ is the rest energy of an electron ($E_0 \approx 0.511$ MeV).

Refering to FIG. 21, the annuli from the three foil stacks will add concentrically at the mask/wafer 32. These foils will each have an extractable phosphor screen to determine the electron-beam diameter and position. The total power is equal to the sum of the radiation emitted from all the stacks. Thus the total X-ray power is increased over that of an individual foil stack. For example, a three-stack radiator system capable of producing 60 mW of soft X-rays in the 800 eV to 3.5 keV region of the spectrum would consist of individual stacks constructed of 35 foils of 1.5-$\mu$m beryllium with spacing between the foils of 250 $\mu$m. Assuming a 100 MeV electron beam, the angle of peak cone emission is approximately $1/\gamma \approx 5$ mr. The next foil stack can miss most of the radiation cone if it subtends an angle of less than $1/2\gamma$. Assuming a 2-mm diameter foil stack, the spacing between the foil stacks would be 40 cm.

Figure 23:
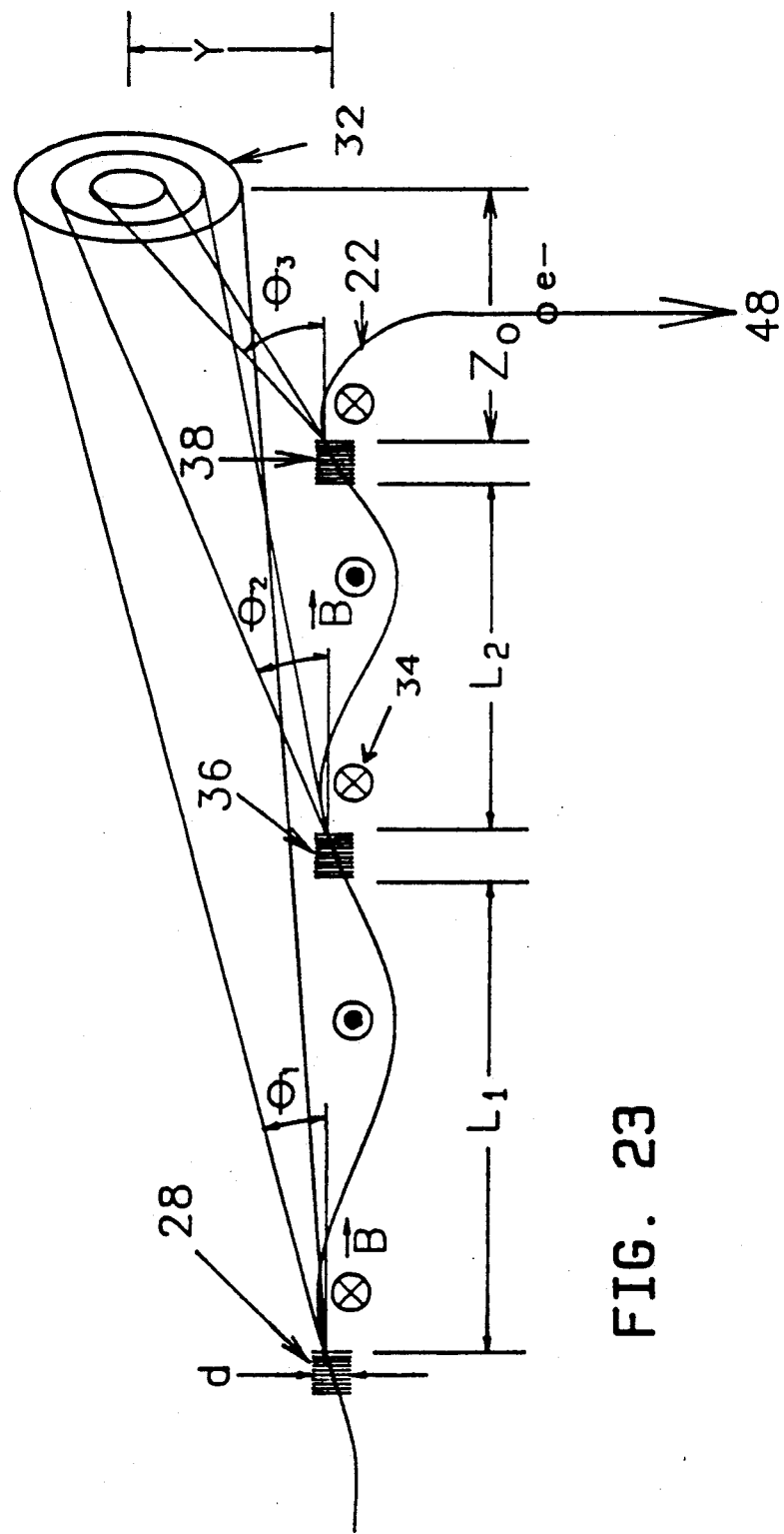
FIG. 23 shows the transition radiation emitted from foil stacks in an undulated electron beam.

In another embodiment we can use dipole magnets to steer the electron beam through the foil stacks such that the conical X-ray annulus misses succeeding stacks and adds concentrically at the mask/wafer. As illustrated in FIG. 23, the embodiment includes an accelerator 20 which emits a well collimated electron beam 22 which strikes the first foil stack 28 which in turn emits X rays in a conical annulus. The electron beam is steered by small bending magnets through the foil stack 28 in such a way that X rays miss the second foil stack 36. The electron beam 22 is again steered by small bending magnets through succeeding foil stacks. The trajectory of the electron beam 22 is adjusted by small bending magnets 34 such that the emitted X ray annuli add concentrically at the mask and wafer 32. The electron beam 22 is again bent so it passes through the third foil stack 38. The angle that the electron beam strikes the third foil stack is adjusted so that the radiation annuli all add up concentrically. The total power is equal to the sum of the radiation emitted from all of the stacks.

The angle of electrons leaving the $n_{th}$ foil stack $\theta_n$, and hence the direction of the conical X-ray annulus is adjusted so that the conical X-ray annulus just misses the succeeding $n+1$ foil stack. From simple geometry considerations $\theta_n$ should be then greater than:

$$\theta_n > 2\frac{E_0}{E} + \frac{D_{n+1}}{2L_n} \quad (38)$$

where $n = 1, 2, 3$, E is the electron beam energy, $E_0$ is the electron beam rest energy ($E_0 \approx 0.511$ MeV), $L_n$ is the distance between the n and $n+1$ foil stacks, and $D_{n+1}$ is the diameter of the $n+1$ foil stack and foil stack holding means.

For the conical X-ray annuli to add concentrically, the angles $\theta_n$ for $n = 1, 2, 3$ that the electron beam must strike the $n_{th}$ foil stack is given by $$\theta_n \approx \frac{Y}{L_1 + L_2 + \ldots + L_{n-1} + Z_0} \quad (39)$$

where $Z_0$ is the distance between the last foil stack and the mask/wafer target, Y is the distance from the axis of the foil stack and the center of the mask/wafer target, and it has been assumed that the foil stack length is much smaller than the spacing between the individual foil stacks; $L_n >> M(l_1 + l_2)$.

6. Multiple Stations

In order to reduce the cost of production, one must increase the number of stations per accelerator. For a transition radiator, the number of stations is limited by the deterioration of the electron-beam quality or emittance as the electrons traverse the foils and suffer elastic coulomb scattering from the atoms of the foil material. To overcome scattering, the total thickness of the combined number of foil stacks is limited to be less than the thickness needed to make the scattering angle less than the transition radiation cone angle from unscattered electrons.

Changing the direction of the electron beam by elastic scattering will also change the direction of the X rays. Thus when the electrons pass through the foils and suffer collisions their directions are altered and the angle of emission (or half angle) of the X-ray photons is also altered. This increases the area that the X rays strike resulting in the power per unit area decreasing since the number of X-ray photons does not increase. Since we are interested in keeping the power per unit area as high as possible, we wish to minimize the total amount of scattering. To do this the total amount of scattering is limited by reducing the total number of foils or foil stacks that are used. Since the half angle of the transition radiation cone is $1/\gamma$, we wish to keep the total scattering to be less than:

$$\theta_S < \frac{1}{\gamma}; \quad (40)$$

then the angle of emission of the photon beam will be roughly $$\theta = \left(\theta_S^2 + \frac{1}{\gamma^2}\right)^{\frac{1}{2}} \quad (41)$$

Thus if the $\theta_S = 1/\gamma$, the total amount of angular spread on the transition radiation cone will be only increased by a factor of $\sqrt{2}$, and the total area that the X rays strike will be increased by a factor of 2. The power per unit area will be decreased by a factor of 2.

The total amount of foil material that the electron beam must go through is given by the product $MNl_2$, where M is the number of foils in a stack and N is the number of stacks. A reasonable approximation to the amount of scattering in this length is given by the rms angular spread due to multiple scattering. From V. L. Highland ("Some practical remarks on multiple scattering", Nucl. Instrum. Methods, 129, pp. 497–499, 1975), this is given by:

$$\theta_S \approx \left(\frac{12}{E}\right)\left[\frac{NMl_2}{X_0}\right]^{\frac{1}{2}}\left(1 + \frac{1}{9}\log_{10}\left(\frac{NMl_2}{X_0}\right)\right) \quad (42)$$

where E is the electron-beam energy in MeV, $X_0$ is the radiation length of the foil material, M is the number of foils and $l_2$ is the foil thickness. Substituting the equation for scattering into the condition $\theta_S < 1/\gamma$, we get the transcendental equation:

$$\frac{E_0}{12} = \left[\frac{NMl_2}{X_0}\right]^{\frac{1}{2}} \left(1 + \frac{1}{9} \log_{10}\left(\frac{NMl_2}{X_0}\right)\right) \quad (43)$$

This equation can be solved for N iteratively for substituting the first approximate value of:

$$N \approx \left(\frac{E_0}{12}\right)^2 \left(\frac{X_0}{Ml_2}\right) \quad (44)$$

It should be noted that for the condition given by the relationship $\theta_S < 1/\gamma$, the total number of foil stacks is independent of the electron-beam energy. Thus all we need to know is the foil material, number and thickness in order to establish the number of foil stacks, N, that can be put in the electron beam without appreciably altering the angle of emission and, hence, the total power per unit area.

Figure 24:
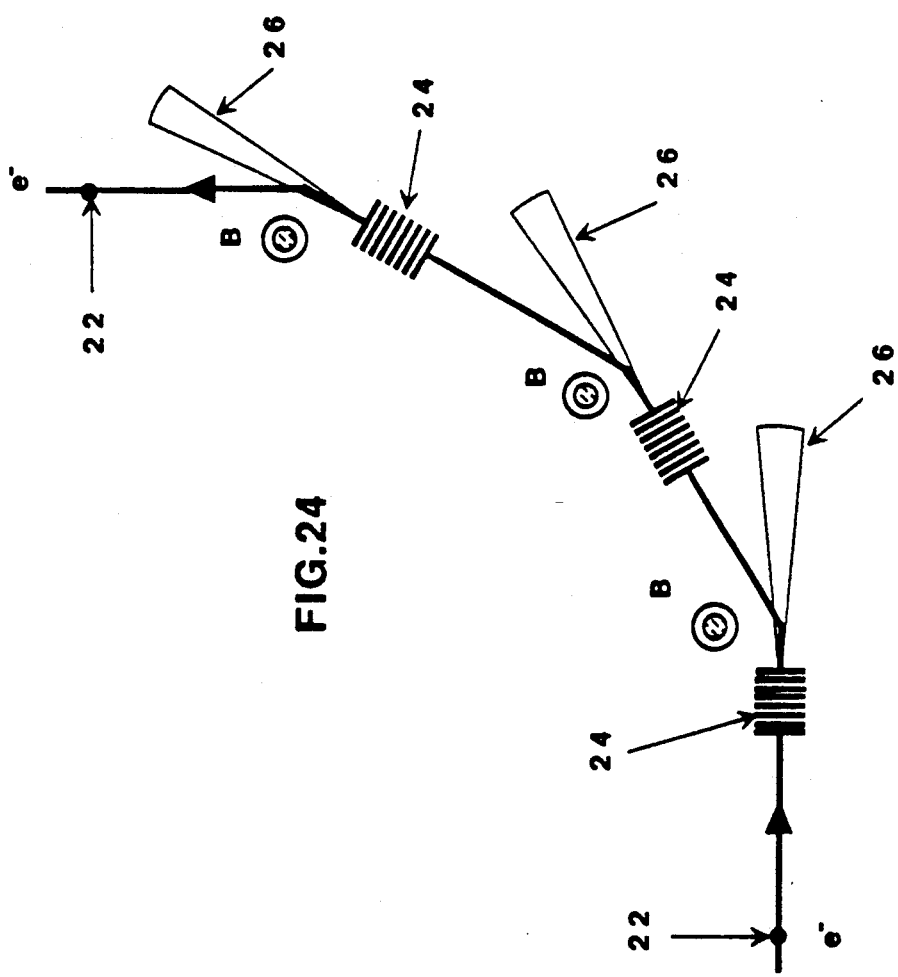
FIG. 24 shows multiple stations for more than one lithograph station.

As an example, we take M=42 foils of $l_2=1$ μm beryllium ($X_0=3.67$ cm). Substituting into the transcendental equation (40) we obtain the total number of stations we can have without violating the condition $\theta_S < 1/\gamma$. We obtain N=21. Thus there are 21 separate stacks before the condition $\theta_S < 1/\gamma$ is violated. This allows the maximum use of the electron beam and the maximum number of lithography stations. How much a system might be used is shown in FIG. 24. The beam is bent slightly between each stack, allowing the emitted photon beam to escape out a side port.

In addition to elastic scattering, the electron beam will lose energy as it passes through the foils. For most materials the loss is 1.5 to 4 MeV/gm/cm². For example, beryllium loses 1.61 MeV/gm/cm² or 2.97 MeV/cm. A 100 MeV electron beam passing through the beryllium foil stack discussed above (42 foils of 1 μm each) will lose 6762 eV or only 0.0068% of its energy. For 21 foil stacks it will lose 143 keV or 0.143% of its energy. For most conventional linacs the electron-beam energy spread is not been than 0.2% of its energy. Thus the total loss of passing through 21 stacks of beryllium foils (42 foils 1-μm thick each) is less than the energy spread of the electron beam. Thus the loss associated with the electron beam passing through the foil stacks can be neglected for most applications.

7. Foil Cooling and Heat Redistribution

For high average current to pass through a foil stack, methods of cooling and distributing the heat are needed. The amount of temperature rise in the foil is inversely proportional to the area of the electron-beam striking the foils. Three methods of increasing the average area of the electron beam striking the foils are possible: (1) conduction of the heat from the foils by a high thermally conductive support structure (2) convection of the heat away from the foils using low density, low electron scattering gas (3) increasing the foil area that the electron strike by rotating the foils.

7.1 Cooling by Conduction

The foils in the embodiment of FIG. 4 were cooled by conducting the heat from the foils to the aluminum rings foil holders and then to an aluminum support structure and, hence, to the outside environment. We have found this to be practically possible with beam currents as high as 66 μA and with spot sizes of 1-mm diameter. Electron-beam powers as high as 10.6 kW have been successfully put through foil stack without being changed. Thus for electron beam powers of 10 kW or less conduction of the heat away from the foils to the outside environment has been achieved by the inventors.

7.2 Cooling by Convection

Foils can also be cooled by flowing gas across the their surfaces and removing the heat by convection. The gas must be of low density, high thermal conductivity, and low electron scattering. Helium is an excellent choice. The introduction of the gas into the environmental of the transition radiator is easily done. A window for the electron beam to enter must be used to separate the accelerator environment which must be a vacuum from that of the transition radiator which is now a gas environment. The window can be of thin aluminum or beryllium. The gas will also act to cool the window. The window must be designed so that the bremsstrahlung radiation emitted from it does not reach the mask/wafer target. This can be done by not having the window aligned with the perpendicular axis of the foil stack (optical axis of the conical X-ray annulus).

7.3 Cooling by Foil Rotation

Figure 25:
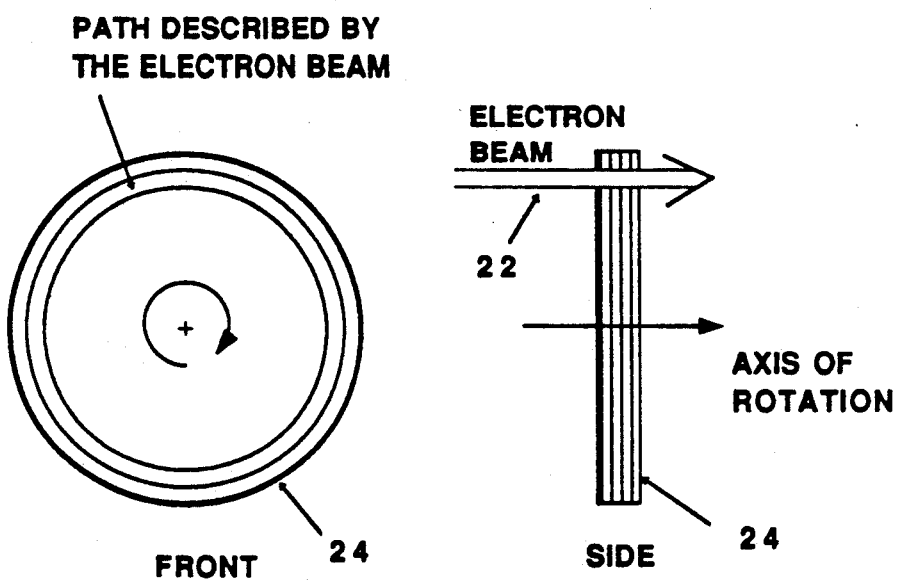
FIG. 25 shows a rotating foil stack for foil cooling and the path of the electron beam through the foil stack.

In the embodiment shown in FIG. 25, the foil stack 24 is rotated so that the area that the electron beam 22 strikes is increased over time. The foil is rotated about an axis so that the electron beam 22 describes a circular path on the foil stack. The trajectory of the path is shown in FIG. 25. The entire rotating foil system can be remotely inserted into the beam; alternatively, a phosphor screen (not shown) can be inserted into the beam for proper alignment and positioning of the electron beam near the edge of the cool boundary of the rotating foil. A high brightness focused transition X-ray source will operate at high average currents of 200 to 500 μA.

Figure 26:
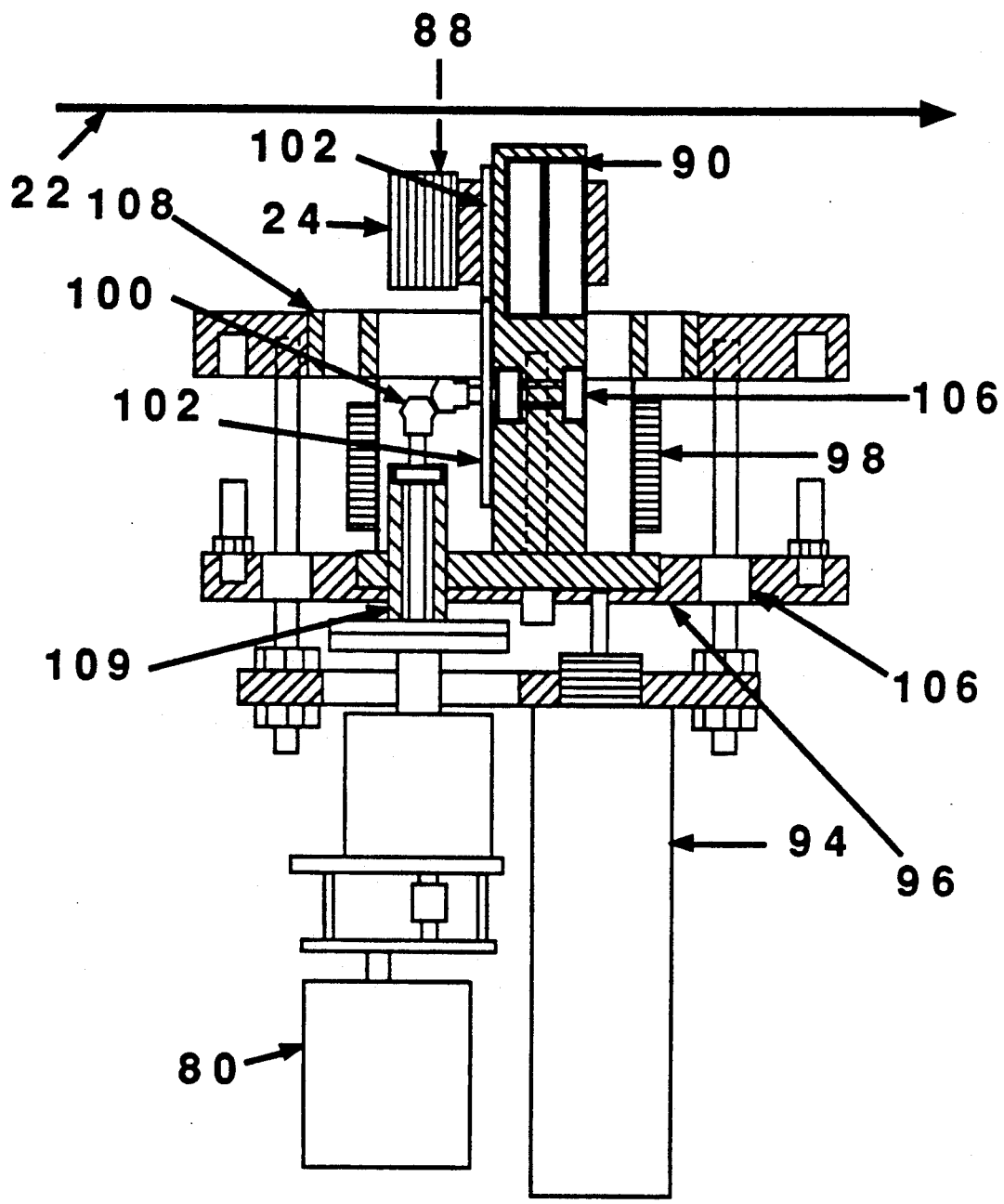
FIG. 26 shows a more detailed drawing of the rotating foil stack for the maintenance of a low foil temperature during the production of high-intensity X rays.

A more detailed drawing is shown in FIG. 26. The embodiment utilizes a gear-driven foil rotator. The foil stack 24, rotating bearing 90, and gear assembly 102 are placed inside the electron-beam environment of a vacuum. The foils are mounted to rigid aluminum rings 88. The entire foil stack is bolted to a rotating bearing 90. The electron beam 22 passes through the hollow bearing 90 and through the foil stack 24. The rotating bearing 90 is rotated by a gear assembly 100 and 102 driven by an electric motor 80. The gear assembly consists of two bevel gears 100 and two spur gears 102. The rotation motion from the motor 80 is fed through the vacuum flange 108 by a motor vacuum feed through 108. A vacuum flange 108 isolates the foil stack and gear assembly, which is in the vacuum, from the motor which is in the air. The entire assembly of foil stack 24, rotating bearing 90, and gear assembly 100 and 102, are mounted on a support flange 96 which is in the vacuum housing (not shown) and are moved by pneumatic actuators 94 so that the foil stack 24 can be inserted and withdrawn into the electron beam 22. A bellows 98 attached to the vacuum flange 108 permits the assemblage to move in and out of the electron beam 22 without degrading the vacuum.

To calculate the needed rotation speed and the diameter of the foils for adequate cooling, we first define the following parameters:

v=foil rotational velocity
ω=foil angular velocity
r=electron-beam radius (cm)

R = radius of the circular path described by an electron beam on a rotating foil (cm)
$I_p$ = peak macropulse current (amps)
$T_w$ = macropulse length (sec)
$T_r$ = macropulse repetition period (sec)
$l_2$ = foil thickness (cm)
$\rho$ = foil density (g/cm$^3$)
C = foil specific heat (joules/g°C.)
dE/dx = energy lost by a high energy electron beam (volts/cm) in passing through a foil of thickness dx.
$R_T$ = thermal resistance (°C./watts)
$C_T$ = thermal capacitance (joules/°C.)
K = foil thermal conductivity (watts/cm°C.)
$\tau$ = thermal time constant for foil cooling (sec)
$T_m$ = foil melting temperature The energy U deposited by a single pulse of length $T_w$ and current $I_p$ in passing through a foil of thickness a is $$U = I_p T_w \frac{dE}{dx} a \quad (45)$$

The increase in foil temperature $\Delta T$ for this energy deposited into a volume $\pi T^2 a$ by an electron beam of radius r is $$\Delta T = \frac{U}{C\rho \pi r^2 a} \quad (46)$$

Accordingly, the temperature rise for one macropulse will be:

$$\Delta T = \left( \frac{I_p T_w \left( \frac{dE}{dx} \right)}{C\rho \pi r^2} \right) \quad (47)$$

If we rotate the foil about a central normal axis which is parallel to and displaced a distance R from the electron-beam axis, then the electron beam will describe a circular path on the foil of width 2r and circumference $2\pi R$.

If the foil rotates an angle $\theta = 2r/R$ in time $T_r$ corresponding to an angular velocity $\omega = 2r/R \cdot T_r$ radians/sec, then the energy carried by the next electron-beam macropulse will be deposited in a new volume of material. If R is chosen so that sufficient time elapses between revolutions to allow a given heated volume to cool to its original baseline value, then the foil temperature will never rise above the temperature rise induced by a single pulse.

This goal can be achieved if the foil rotation period $$T = \left( \frac{\pi R}{r} \right) T_r \approx 5\tau \quad (48)$$

Here, $\tau$ is the thermal time constant, the time required for a given foil volume $\pi r^2 a$ to cool to 1/e of its original value.

The outer cold boundary of the foil, located a distance x from the outer edge of the electron-beam path will be held at 25° C. The foil will cool by conduction of heat to this cold boundary with a thermal time constant $\tau = R_T C_T$, where $R_T$ is the thermal resistance from the hot volume to the cold boundary and $C_T$ is the thermal capacitance of the hot volume where $$C_T = C\pi T^2 a\rho \quad (49)$$

and $$\left( \frac{1}{8\pi Ka} \right) \ln \left( \frac{x}{r} \right) < R_T < \left( \frac{x}{2Kar} \right) \quad (50)$$

The upper bound on $R_T$ assumes the heated volume $\pi r^2 l_2$ is cooled by conduction only through a narrow path of width 2r, foil thickness $l_2$, and length x, and the lower bound assumes the heated volume is cooled by conduction through radial paths extending outward from the heated zone to a quarter circular cold zone a distance x from the edge.

The lower and upper bounds for the thermal time constant $\tau = R_T C_T$ are 0.67 ms and 24.4 ms, respectively, for x = 2 mm, r = 0.5 mm, and K = 2.18 watts/cm°C. for beryllium foil. We wish to use an average current of 200 $\mu$A with $I_p$ = 158 mA, $T_{w1}$ = 1.8 $\mu$S, $T_{r1}$ = 2.5 mS (400 hz). If we again use beryllium foils (C = 1.83 joules/g°C., $\rho$ = 1.85 g/cm$^3$, dE/dx = 2.97 × 10$^6$ v/cm) then the increase in temperature is $\Delta T$ = 55° C. This is well below the foil melting point $T_m$ = 1285° C.

If we design based upon worst case cooling and assume $\tau \approx 20$ ms and choose a rotation period of $5\tau = 100$ ms, corresponding to 600 RPM, then the foil temperature will not rise above 55° C. Using eqn. (50) and the parameters specified above R = 0.64 cm. The radius of the foil to the cold boundary R + x = 0.66 cm. Accordingly, a 1.3 cm diameter foil rotated at 600 RPM will not heat above 55° C. Thus, using the embodiment shown in FIG. 26 with a foil diameter of 1.3 cm, the electron beam 1 mm in diameter, and 2 mm from the edge of the foil ring holders, the rotation speed is 600 rpm.

What is claimed is:

1. An apparatus for generating high-intensity X rays for lithography using a mask to define against areas on a wafer for the production of integrated circuits comprising:
    electron-beam-source means for generating an electron beam;
    X-ray means comprising a foil stack for integrating electrons from said electron-beam-source means for generating a beam of soft X rays from transition radiation, said X-rays having a conical power density, hereinafter called the conical X-ray annulus;
    radiation uniformity means for achieving X-ray power uniformity across the mask and wafer target areas with an intensity variation of ±5% or less;
    magnetic means for separating the electron beam from the X-ray beam;
    housing means for providing an optical medium for the apparatus, and a controlled environment for said X-ray means and said radiation uniformity means.

2. An apparatus for generating multiple high-intensity X-ray beams for lithography in the production of integrated circuits comprising:
    electron beam source means for generating and electron beam;
    a plurality of X-ray means for generating soft X rays from transition radiation, at least one of said X-ray means comprising a foil stack; said X-rays having a conical power density, hereinafter called the conical X-ray annulus;

a plurality of radiation uniformity means for achieving X-ray uniformity across the mask and wafer target areas with an intensity variation of ±5% or less;

a plurality of magnetic means for separating the electron beam from the X-ray beam;

a housing means for providing an optical medium for the apparatus, and a controlled environment for said X-ray means, and said radiation uniformity means.

3. Apparatus as in claim 1 or 2 wherein the electron-beam source has an energy, E, selected, such that the outer radius, r, of the area of said conical X-ray annulus at the mask/wafer is given approximately by:

$$r = 2Z_0 \left( \frac{E_0}{E} \right),$$

where $Z_0$ is the distance between the foil stack and the mask/wafer target, where E is the electron beam energy, $E_0$ is the electron beam rest energy ($E_0 \approx 0.511$ MeV), such that the conical X-ray annulus area matches or is smaller than the desired exposure area of said mask/wafer target, and such that there is adequate distance $Z_0$, between said foil stack and mask/wafer target ($Z_0$ is approximately 1 to 3 meters) for radiation shielding and electron-beam transport.

4. Apparatus as in claim 1 or 2 wherein the electron-beam source has an electron-beam diameter, D, at the foil stack and half-angle divergence, $\theta d$, at the foil stack selected such that said electron-beam diameter, D is bounded by:

$$D \leq \frac{\Delta x Z_0}{g}$$

where g is the distance between the mask and wafer, $Z_0$ is the distance between foil stack and the mask/wafer target, and $\Delta x$ is the blurring or shadowing of the minimum circuit feature size, x;

such that said electron beam divergence is bounded by;

$$\theta_d \leq \left( \left( \frac{\Delta R}{\Delta g} \right)^2 - \left( \frac{E_0}{E} \right)^2 \right)^{\frac{1}{2}}$$

where $\Delta g$ is the maximum variation in mask-to-wafer distance and is bonded by:

$$\Delta g \leq 5 \ \mu m$$

where $\Delta R$ is the error introduced to the minimum circuit feature size, x, by the source divergence, and $E_0$ is the electron rest energy ($E_0 = 0.511$ MeV);

where $\Delta x$ and $\Delta R$ are bounded by:

$$(\Delta x^2 + \Delta R^2)^{\frac{1}{2}} \leq 0.3x$$

5. An apparatus as in claim 1 or 2 further comprising:

X-ray optic means for the efficient collection of X rays and the transporation of the X rays to the mask/wafer target area.

6. An apparatus as in claim 1 or 2 wherein said X-ray means produces X-rays at an energy less than 4 keV, said X-ray means comprising:

number of foils, M, arranged as a succession of parallel elements to form said stack, the foils having a minimum thickness $l_2$;

holding means for holding the foils in said stack and for maintaining a spacing $l_1$ between adjacent foils in said stack;

such that:

$$M \geq (0.5) \frac{2}{\mu l_2},$$

where $\mu$ is the absorption coefficient of the foil material at the frequency $\omega$ of the X-ray beam; where $$l_2 \leq 1.34 \frac{\lambda}{\frac{2}{\gamma^2} + \frac{\omega_p^2}{\omega^2}}$$

where $\lambda$ is the wavelength of the X-rays at the peak frequency $\omega$, where $\lambda = c/2\pi\omega$, where c is the speed of light, and where $\gamma = 1/(1-\beta^2)^{\frac{1}{2}}$ where $\beta$ is the velocity of the electrons in the electron beam relative to the speed of light, and where $\omega_p$ is the plasma frequency of the foil material; where $$l_1 > (0.5) \frac{\lambda \gamma^2}{2}$$

if the housing means provides a vacuum environment; and where $$l_1 > (0.5) \frac{\lambda}{\frac{2}{\gamma^2} + \frac{\omega_{pg}^2}{\omega^2}}$$

if the housing means provides a gas environment, where $\omega_{pg}$ is the plasma frequency of the gas.

7. Apparatus as in claim 6 wherein said foils comprise beryllium.

8. Apparatus as in claim 6 wherein said foils and said mask substrate comprises silicon.

9. Apparatus as in claim 1 or 2 wherein said X-ray means compises:

a plurality of foil stacks spaced such that the conical X-ray annulus generated from each foil stack misses the succeeding foil stacks such that said annuli wall add in concentric rings at the mask target areas;

holding means for the foil stack such that said holding means does not interfere with the transmission of the X rays to mask target areas, wherein the radius, $r_0$, of the foil stack and its holding means should not be less than:

$$r_0 = 2 \left( \frac{E_0}{E} \right) L,$$

where L is the distance between the foil stacks, E is the electron beam E, $E_0$ is the rest energy of an electron ($E_0 \approx 0.511$ MeV).

10. Apparatus as in claim 1 or 2 wherein said X-ray source means comprises:
   a series of foil stacks;
   magnetic means for changing the electron-beam direction at each foil stack,
   where such magnetic means is composed of dipole magnets,
   where two pairs of said dipole magnets are located between each succeeding foil stack,
   where the magnetic fields of said two pairs of dipoles are of opposite polarity,
   where each magnetic field of said pair of dipole magnets are adjusted such the angle of the electron beam is directed such that the conical X-ray annulus generated from each foil stack miss succeeding foil stacks and add concentrically at the mask/wafer target areas,
   where the angle of electrons leaving the n'th foil stack (and hence the direction of the conical X-ray annulus) is determined approximately by:

$$\theta_n > 2\frac{E_0}{E} + \frac{d_{n+1}}{2L_n},$$

and $$\theta_n \simeq \frac{Y}{L_1 + L_2 + \ldots + L_{n-1} + Z_0}$$

where E is the electron beam energy, $E_0$ is the electron beam rest energy ($E_0 \approx 0.511$ MeV), $L_n$ is the distance between the n and n+1 foil stacks, and $Z_0$ is the distance between the last foil stack and the mask/wafer target, Y is the distance from the axis of the foil stack and the center of the mask/wafer target, $d_{n+1}$ is the diameter of the n+1 foil stack and foil stack holding means.

11. Apparatus as in claim 1 or 2 wherein said radiation uniformity means comprises electron-beam directional means
   where said electron-beam direction means is composed of plurality of dipole magnets,
   where said dipole magnets are located between the electron-beam means and the foil stack,
   where said dipole magnets magnetic field is adjusted so that the electron-beam direction through the foil stack is changed,
   where said electron beam is held fixed at a particular location on said foil stack,
   such that the direction of the X rays changes but not the point of emanation,
   such that the time average X-ray power uniform across the mask and wafer is $\pm 5\%$ or less.

12. Apparatus as in claim 1 or 2 wherein said radiation uniformity means comprises electron optic means
   where said electron optics means is composed of either a torroidal magnet or a plurality of quadrapole magnets,
   where said electron optic is located between said electron-beam source and said foil stack
   where said electron optic is adjusted such that said conical X-ray annulus is filled and
   such that the resulting X-rays power is uniform within $\pm 5\%$ or less across the target area of the mask.

13. Apparatus as in claim 12 wherein said electron optic means for adjusting the electron-beam diameter, D, and electron beam divergence angle, $\theta_d$, at the foil stack to be:

$$D < \Delta x \frac{Z_0}{g},$$

where g is the mask-to-wafer gap, where $Z_0$ is the distance from the foil stack to the mask/wafer, where $\Delta x$ is the maximum tolerable blurring of the minimum sized circuit feature, x, where nominally $\Delta x < 0.3\, x$, $$\theta_d \simeq \frac{E_0}{E},$$

where E is the electron beam energy, $E_0$ is the electron beam rest energy ($E_0 \approx 0.511$ MeV), such that the X-ray power uniformity across the mask and wafer is less than $\pm 5\%$.

14. Apparatus as in claim 1 or 2 wherein said radiation uniformity means comprises an X-ray optics means and electron optic means,
   where said X-ray optics means is located between said X-ray means and said mask and wafer target,
   where said electron optics means is composed of either a torroidal magnet or a plurality of quadrapole magnets,
   where said electron optic is located between said electron-beam source and said foil stack,
   where said electron optic is adjusted such that said conical X-ray annulus is filled,
   such that the resulting X-rays power is uniform within $\pm 5\%$ or less across the mask/wafer target area.

15. Apparatus as in claim 5 wherein said X-ray optic means comprises a surface-of-revolution lens whose axis of revolution lies along the directed axis of the conical X-ray annulus,
   said conical X-ray annulus intersects the inner surface of said surface-of-revolution at angles less than or equal to $\omega_p/\omega$, where $\omega_p$ is the plasma frequency of the optical medium and $\omega$ is the frequency of the X rays,
   said surface-of-revolution lens lies between said foil stack and said mask/wafer target,
   and said X rays are collected on to a desired area on the mask/wafer area.

16. Apparatus as in claim 15 wherein said surface-of-revolution lens comprises a smooth-bore tube comprising a material selected from the groups; metal, glass, or quartz.

17. Apparatus as in claim 15 wherein surface-of-revolution lens comprises:
   a longitudinal surface in the direction of the axis of revolution that is curved to make the resulting radiation pattern uniform for the uniform exposure of photoresist;
   a baffle to block direct X-ray paths from the foil stack to mask/wafer target area so that only reflected X-rays each the mask/wafer target area;
   wherein said longitudinal surface is defined by the following variables:

the minimum angle in the portion distribution, $\theta_{min}$ (photons produced with smaller angles will be blocked by the baffle and those with larger angles will be reflected to the mask), the maximum angle in the photon distribution $\theta_{max}$ (Photons produced with larger angles are ignored), the diameter of the mask to be uniformly illuminated, $d_s$, the exit diameter of the lens to be designed, $d_e$;

where said longitudinal surface is computer using a simple computer program that computes the following, from simple geometrical considerations:

distance from the source to the mask, L:

$$L = \frac{d_s \theta_{min}}{2}$$

distance from the exit end of the lens to the mask, $L_1$;

$$L_1 = L - \frac{d_e \theta_{min}}{2}$$

distance from the source to the exit end of the lens, $L_2$;

$$L_2 = L - L_1$$

lens radius at exit;

$$r_e = \frac{d_e}{2}$$

said computer program begins by assigning the starting coordinate pair (z,r) to the lens cross-section, where $z = L_2$, and $r = r_e$. The program further assigns the slope of the lens shape to an angle slightly larger than $\theta_{min}$:

$$\frac{dr}{dZ} = \theta_{min} - \Delta$$

where $\Delta$ is 1.2 of the bin width of the photon distribution, where the lowest angle photons will just graze the exit portion of the lens and continue on to the mask;

said computer program next steps through positions on the mask, starting with the largest radius and computes the number of photons necessary to fill the photon deficiency where the photons must come from the flux distribution just above $\theta_{min}$;

said computer program then depletes this distribution just the right amount and computes the mean angle of these photons where an X ray from the source, with this mean angle, then intercepts the lens element having a straight line pinned at (r,z) and fixed slope dr/dz, where this intercept defines the next locus of the lens cross-section where the angle formed from this new value of (r,z) to the mask, together with the source angle, define the lens angle dr/dz at this new point, where the computation then iterates until the source angle is equal to or greater than $\theta_{max}$;

said computer program computes the cross-section of the lens is drawn on the display terminal, and a table is written as input for a numerically controlled lathe for the machining of the surface-of-revolution lens.

18. Apparatus as in claim 15 wherein said surface-of-revolution lens are coated on their reflecting surfaces with thin layers of materials that increase the reflectivity of the X-rays from said surfaces.

19. Apparatus as in claim 5 wherein said X-ray optics means comprises a Fresnel Zone plate located between the transition radiator and the mask and wafer.

20. Apparatus as in claim 1 or 2 further comprising a grazing-angle reflector means, where said grazing-angle reflector reflects the X-rays to the mask/wafer target, where said grazing-angle reflector separates the desired soft X-rays from the neutron flux, the hard X-ray bremmstrahlung and other ionizing radiation such that neutron flux, hard X-ray bremsstrahlung and other ionizing radiation does not strike the mask/wafer target, where said grazing-angle reflector lies between said foil stack and said mask/wafer target, where said grazing-angle reflector is composed of either a flat or slightly curved X-ray mirror whose dimensions are determined by the grazing angle, $\theta$, by the distance from the radiator to grazing-angle reflector, $L_g$, and by the angular divergence of the conical X-ray annulus ($\theta \simeq \pm 3/\gamma$). The minimum length, $l_{min}$, of optic is then given by:

$$l_{min} \simeq \frac{6L_g}{\gamma \phi}$$

and the minimum width, $w_{min}$, of the mirror is given by:

$$w_{min} \simeq \frac{6L_g}{\gamma}$$

where the grazing angle of said grazing angle reflector is $\theta_g \geq \omega_p/\omega_c$ where $\omega_p$ is the plasma frequency of the surface material of said grazing angle reflector and $\omega_c$ is the desired cutoff X-ray photon energy.

such that the number of X-rays whose X-ray photon energies $\omega > \omega_c$ are attenuated, where said X-ray photon energies above $\omega_c$ penetrate both the mask substrate and the mask circuit pattern causing blurring of the circuit image, where said cutoff frequency $\omega_c$ is approximately 3 keV.

21. Apparatus as in claim 20 further comprising scanning means for scanning or wobbling the grazing angle reflector is scanned or wobbled such that the time average X-ray power uniformity across the mask and wafer is less than $\pm 5\%$.

22. Apparatus as in claim 1 or 2 further comprising a translating means for moving the mask/wafer target in a rapid fashion such that the time average X-ray power across the mask/wafer target area is less than $\pm 5\%$.

23. Apparatus as in claim 1 or 2 further comprising a cooling means for maintaining the temperature of said foils at values below foil material melting temperature.

24. Apparatus as in claim 23 wherein said cooling means comprises:

means of rotating the foil stack around its central axis;

motor means for supplying circular motion to the foil stack;

housing means for providing an optical medium for the apparatus, and a controlled environment for said foil stack;

coupling means between the motor and the foil stack, where said coupling means transfers motion of the motor to the foil stack from the environment of the motor to the environment of the foil stack.

25. Apparatus as in claim 23 wherein said cooling means comprises:

a low density gas (such as helium) in contact with the foil stack for the conduction of the heat from the foil stack;

housing means for providing an optical medium for the apparatus, and a controlled environment for said foil stack, where said housing means contains the low density gas;

means for the removal and/or cooling of the low density gas.

26. Apparatus as in claim 23 wherein said cooling means comprises:

a foil-stack holding means of high-heat-conductivity material such as aluminum or copper for the transfer of thermal heat in the foil stack to the foil-stack holder;

housing means for providing an optical medium for the apparatus, and a controlled environment for said foil stack, where said housing means is mechanically and thermally connected to the foil-stack holding means such that the heat is transferred to the external environment outside said housing means.

27. Apparatus as in claim 14 wherein said X-ray optic means comprises a surface-of-revolution lens whose axis of revolution lies along the directed axis of the conical X-ray annulus, said conical X-ray annulus intersects the inner surface of said surface-of-revolution at angles less than or equal to $\omega_p/\omega$, where $\omega_p$ is the plasma frequency of the optical medium and $\omega$ is the frequency of the X rays, said surface-of-revolution lens lies between said foil stack and said mask/wafer target, and said X rays are collected on to a desired area on the mask/wafer area.

28. Apparatus as in claim 27 wherein said surface-to-revolution lens comprises a smooth-bore tube comprising a material selected from the groups; metal, glass, or quartz.

29. Apparatus as in claim 27 wherein surface-of-revolution lens comprises:

a longitudinal surface in the direction of the axis of revolution that is curved to make the resulting radiation pattern uniform for the uniform exposure of photoresist;

a baffle to block direct X-ray paths from the foil stack to mask/wafer target area so that only reflected X-rays reach the mask/wafer target area;

where said longitudinal surface is defined by the following variables:

the minimum angle in the photon distribution, $\theta_{min}$ (photons produced with smaller angles will be blocked by the baffle and those with larger angles will be reflected to the mask), the maximum angle in the photon distribution, $\theta_{max}$ (Photons produced with larger angles are ignored), the diameter of the mask to be uniformly illuminated, $d_s$, the exit diameter of the lens to be designed, $d_e$;

where said longitudinal surface is computer using a simple computer program that computes the following, from simple geometrical considerations:

distance from the source to the mask, L:

$$L = \frac{d_S \theta_{min}}{2}$$

distance from the exit end of the lens to the mask, $L_1$:

$$L_1 = L - \frac{d_e \theta_{min}}{2}$$

distance from the source to the exit end of the lens, $L_2$:

$$L_2 = L - L_1$$

lens radius at exit:

$$r_e = \frac{d_e}{2}$$

said computer program begins by assigning he starting coordinate pair (z,r) to the lens cross-section, where $z = L_2$, and $r = r_3$. The program further assigns the slope of the lens shape to an angle slightly larger than $\theta_{min}$:

$$\frac{dr}{dZ} = \theta_{min} - \Delta$$

where $\Delta$ is 1.2 of the bin width of the photon distribution, where the lowest angle photons will just graze the exit portion of the lens and continue on to the mask:

said computer program next steps through positions on the mask, starting with the largest radius and computes the number of photons necessary to fill the photon deficiency where these photons must come from the flux distribution just above $\theta_{min}$;

said computer program then depletes this distribution just the right amount and computes the mean angle of these photons where an X ray from the source, with this mean angle, then intercepts the lens element having a straight line pinned at (r,z) and fixed slope dr/dz, where this intercept defines the next locus of the lens cross-section where the angle formed from this new value of (r,z) to the mask, together with the source angle, define the lens angle dr/dz at this new point, where the computation then iterates until the source angle is equal to or greater than $\theta_{max}$;

said computer program computes the cross-section of the lens is drawn on the display terminal, and a table is written as input for a numerically controlled lathe for the machining of the surface-to-revolution lens.

30. Apparatus as in claim 27 wherein said surface-of revolution lens are coated on their reflecting surfaces with thin layers of materials that increase the reflectivity of the X-rays from said surfaces.

31. Apparatus as in claim 14 wherein said X-ray optics means comprises a Fresnel Zone plate located between the transition radiator and the mask and wafer.

* * * * *